United States Patent
Chang et al.

(10) Patent No.: US 7,486,134 B2
(45) Date of Patent: Feb. 3, 2009

(54) HIGH EFFICIENCY LOAD INSENSITIVE POWER AMPLIFIER

(75) Inventors: Shiaw W Chang, Thousand Oaks, CA (US); Albert Wang, Camarillo, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 11/684,431

(22) Filed: Mar. 9, 2007

(65) Prior Publication Data

US 2008/0048774 A1   Feb. 28, 2008

Related U.S. Application Data

(60) Provisional application No. 60/780,892, filed on Mar. 9, 2006.

(51) Int. Cl.
*H03F 1/14* (2006.01)
(52) U.S. Cl. ...................... 330/51; 330/124 R
(58) Field of Classification Search .................. 330/51, 330/124 R
See application file for complete search history.

(56) References Cited

U.S. PATENT DOCUMENTS

| | | | | |
|---|---|---|---|---|
| 6,496,061 B1 * | 12/2002 | Bloom et al. | ................. | 330/51 |
| 7,030,691 B2 * | 4/2006 | Kim | ............................ | 330/51 |

* cited by examiner

*Primary Examiner*—Steven J Mottola

(57) ABSTRACT

An advanced balanced RF power amplifier circuit is provided. The RF power amplifier has a pair of RF amplification paths constructed to efficiently operate in a high-power mode. When instructed to operate in a low-power mode, one of the amplification paths is deactivated, and optionally, an impedance device is also set to operate at a low-power impedance value. With only one path operating in low-power mode, the network RF topology has changed from the topology of the high-power mode. This new topology provides increased impedance on the active RF amplification path as compared to when both RF amplification paths were active. This increased impedance causes the RF power amplifier to operate more efficiently in its low-power mode. Depending on the specific application and target performance, the impedance may be sufficiently increased simply by deactivating one of the RF amplification paths, and in other cases it may be desirable to switch an active or passive impedance device to operate at a low-power impedance. The impedance device enables further adjustment and tuning of the impedance in the low-power topology.

32 Claims, 14 Drawing Sheets

| POWER MODE | SWITCH | RF IMPEDANCE (device 309) |
|---|---|---|
| HI POWER | RF PATH 1 ON RF PATH 2 ON | LOW (typical <50 ohms) |
| LO POWER | RF PATH 1 ON RF PATH 2 OFF | HIGH (typical > 500 ohms) | freq (1.000GHz to 3.000GHz)

HIGH EFFICIENCY LOAD INSENSITIVE POWER AMPLIFIER

This application claims priority to U.S. patent application No. 60/780,892, filed Mar. 9, 2006, and entitled "High Performance Load Insensitive Power Amplifier", which is incorporated herein in its entirety.

BACKGROUND

The field of the present invention is the construction and use of power amplifiers. More particularly, the present invention relates to power amplifiers that exhibit insensitivity to antenna loading with increased efficiency when operable in multiple power modes.

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and/or data communications in a handheld, telephone-like communication transceiver, a wireless personal digital assistant (PDA) or computer interface. While the different modulation and transmission schemes each have advantages and disadvantages, common goals for all of these devices is minimizing the size and cost of the handset, while maximizing the performance of the transceiver.

In a wireless device an RF power amplifier accepts the RF signal from transceivers and amplifies this RF signal for wireless transmission via the antenna connected to the output of RF power amplifier. In some communication systems, the power amplifier can improve its performance by operating in more than one power mode. By using multiple power modes, mobile communication devices with a limited power source may operate longer or with smaller batteries. Unfortunately, constructing a power amplifier to operate in multiple power modes typically requires adding more components, or in the alternative, making design tradeoffs that allow one power mode to operate at good efficiency while sacrificing efficiency, linearity, or other figure of merits in another mode.

Conventional RF power amplifiers may include multiple stages and, in some applications, include multiple amplification paths. In some configurations this multiple path arrangement is referred to as a "balanced amplifier." Regardless of the architecture, conventional balanced power amplifiers require coupling circuitry to combine the outputs of multiple paths together. Further, because the load presented to the power amplifier changes with variations in the antenna input impedance, conventional RF power amplifiers, whether those that use a single or dual path amplification scheme, generally employ one or more isolators at the output of the amplifier. Antenna impedance changes frequently depending on the location, surrounding environment, and operating mode of the mobile device. For example, the impedance of the antenna may vary between, for example, 20 and 150 ohms, depending on the operating environment of the mobile device. Without a protective isolator or other special protective circuitry, this variation in the impedance presented to the power amplifier causes the performance of the power amplifier to vary, thus degrading overall performance of the mobile device. The isolator minimizes the impedance variation presented to the output stage of the power amplifier. Unfortunately, the isolator is a relatively large and costly component that, because of the possibility of physical contamination, is difficult to integrate onto the same structure on which the power amplifier is fabricated.

Further complicating the design of power amplifier systems, some current and evolving telecommunications standards require operation at more than one power level. Since each power level is typically implemented using a different power chain, many additional components are used to provide for switching and impedance matching. These additional components take up valuable design space, as well as consume power, which is a limited resource on most portable wireless devices.

In constructing a balanced amplifier to operate with multiple power modes, for example, a high power mode and a low power mode, additional mode switching control modules are added to the balance power amplifier architecture. Even with this additional part-count, engineering tradeoffs are typically made so that the high power mode operates quite efficiently, but the low power mode is forced to operate at a less desirable efficiency level. Accordingly, known multi-mode balanced amplifiers are bulky, cumbersome, and do not operate with good efficiency in the lower power modes.

U.S. Pat. No. 6,954,623, issued Oct. 11, 2005, and entitled "Load Variation Tolerant Radio Frequency (RF) Amplifier", discloses an amplifier construction that provides for improved isolation over previously known balanced amplifiers. However, advancing telecommunications standards, as well as the desire to make mobile devices smaller and more powerful, places further burdens on the design and construction of power amplifiers. Accordingly, there exists a need for a power amplifier system with improved efficiency, sufficient linearity, and with a construction that can be compactly integrated into wireless devices. In particular, there exists a need for a power amplifier that can efficiently operate in its low power mode, without the need to excessively increase part count and sacrifice much performance of other figures of merit.

SUMMARY

Briefly, the present invention provides an advanced balanced RF power amplifier circuit The RF power amplifier has a pair of RF amplification paths constructed to efficiently operate in a high-power mode. When instructed to operate in a low-power mode, a particular one of the amplification paths is deactivated, and optionally, an impedance device is also set to operate at a low-power impedance value. With only one path operating in low-power mode, the network RF topology has changed from the topology of the high-power mode. This new topology provides increased impedance on the active RF amplification path as compared to when both RF amplification paths were active. This increased impedance causes the RF power amplifier to operate more efficiently in its low-power mode. Depending on the specific application and target performance, the impedance may be sufficiently increased simply by deactivating a particular one of the RF amplification paths, and in other cases it may be desirable to switch an active or passive impedance device to operate at a low-power impedance. The impedance device enables further adjustment and tuning of the impedance in the low-power topology.

In one example, the RF power amplifier receives an RF input signal, and splits the RF input signal on to a first RF amplification path and a second RF amplification path. Each RF amplification path has a pair of cascaded RF transistors that cooperate to operate as a two-stage power amplifier. A power combiner receives the output from the RF amplification paths, and outputs an amplified RF signal. When operating in its high power mode, both RF amplification paths are active. Further, components have been selected and sized so that the network RF topology provides a desirable impedance value at the output RF transistor in each RF amplification path.

When the RF power amplifier is instructed to operate in a low power mode, the power to the RF transistors is disrupted in the second RF amplification path, thereby deactivating the second RF amplification path. Additionally, the impedance value is also changed for an impedance device connected to the power combiner. With the second RF path deactivated, and the impedance device operating at a low-power impedance, the network RF topology has changed. Of particular importance is the impedance at the RF transistor output port of the first RF amplification path. The new RF topology has been designed to cause this impedance to increase, thereby enabling the first RF amplification path to operate much more efficiently in low-power mode.

Advantageously, the disclosed power amplifier operates efficiently in both the high-power mode and the low-power mode, and does so using a highly compact footprint. Further, the power amplifier uses a particularly simple power control process, so part-count and complexity is reduced from known constructions.

BRIEF DESCRIPTION OF THE DRAWINGS

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views. It will also be understood that certain components and details may not appear in the figures to assist in more clearly describing the invention.

FIGS. 8-20 illustrate block diagrams, circuits, and results for an example WCDMA power amplifier system in accordance with the present invention:

FIG. 8: WCDMA PCS band FEM block diagram
FIG. 9: Schematic of a switched LIPA
FIG. 11: Simulated S (1,1) at the input of LIPA for low and high mode
FIG. 12: The schematic of a coupler plus detector
FIG. 13: Simulated coupler performance
FIG. 14: Simulated Vdet as a function of input power at −20 C, 25 C and 85 C
FIG. 15: Assembly of FEM on FR4 laminate
FIG. 18: Pout variation under 2.5:1 VSWR
FIG. 19: ACPR1 variation under 2.5:1 VSWR
FIG. 20: Total Icc variation under 2.5:1 VSWR

DETAILED DESCRIPTION

Figure 1:
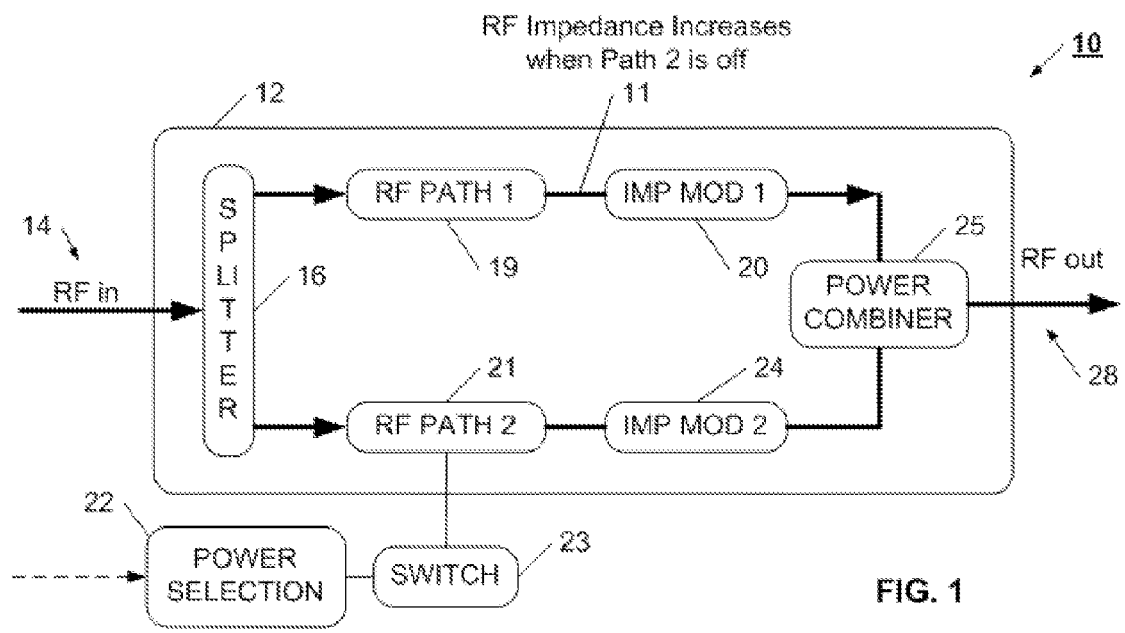
FIG. 1 is a simplified block diagram of a high efficiency load insensitive power amplifier in accordance with the present invention.

Referring now to FIG. 1, power amplifier system 10 is illustrated. Power amplifier 10 is a high efficiency load insensitive power amplifier. As such, the power amplifier system 10 may advantageously be used in a wide variety of radio frequency devices. For example, power amplifier system 10 may be used in mobile communication devices such as mobile handsets, wireless personal data assistants (PDA's), wireless network adapter cards, and other wireless or radio devices. Desirably, power amplifier system 10 operates in a highly efficient and linear manner, and may be constructed in a relatively small footprint to facilitate compact and efficient design. Furthermore, power amplifier system 10 is particularly adapted for evolving and advanced wireless communication standards. For example, some current and evolving telecommunications standards require a wireless device to operate in multiple power modes. In a specific example, the WCDMA communication standard requires compliant wireless devices to operate in either a high power mode or a low-power mode responsive to a selection command. In this way, network or infrastructure controllers are able to trigger the power modes of mobile devices to facilitate improved communication and higher device densities in a network. Although power amplifier system 10 will be described with reference to specific communication standards, it will be appreciated that power amplifier system 10 may be widely adapted to other RF devices and other communication standards. Also, power amplifier 10 is described for use with RF communication systems typically operating in the range of about 800 MHz to about 2000 MHz. It will be appreciated that simple adjustments to component selection, sizing, and placement may be made for operation at other frequencies.

Power amplifier system 10 is generally an advanced balanced amplifier 12 Since the construction and operation of a general balanced power amplifier is well known, specific circuit implications will not be described in detail. For further detailed teachings regarding the design and construction of a balanced radio amplifier, U.S. Pat. No. 6,954,623, granted Oct. 11, 2005, and entitled "Load Variation Tolerant Radio Frequency (RF) Amplifier" is incorporated herein in its entirety. The '623 patent, which is owned by the assignee of the current application, describes a balanced amplifier system adapted to compensate for a power gain imbalance caused by antenna load variation at the output of the power amplifier. More particularly, the disclosed balanced power amplifier adaptably adjusted the gain of each of the amplifier paths of the balanced power amplifier.

Power amplifier system 10 receives an RF signal at an RF input 14. In one example, the RF input 14 is received from the output of an RF transmitter or RF transceiver. The RF input is received into the balanced amplifier 12. The balanced amplifier 12 has a splitter 16 for splitting the RF input signal 14 into a first RF path 19 and a second RF path 21. These RF paths typically have active amplification devices, such as RF transistors, and therefore are also referred to as RF amplification paths. Alternatively, these RF paths may also be referred to as channels or amplification channels. It will be appreciated that splitter 16 may be constructed to adjust the phase relationship between the output paths according to application requirements. In one example, splitter 16 may set the phase of RF Path 1 (19) to +45°, and may set the phase of RF path 2 (21) at −45°. In this way, the RF paths are initially 90° out of phase. It will be appreciated that other phase relationships may be set.

Each RF path also includes a respective impedance module. As illustrated, impedance module 1 (20) performs a phase shifting function complementary to the phase shift of path 1 at splitter 16, and impedance module 2 (24) also performs a phase shifting function complementary to the phase shift of path 2 at splitter 16. Continuing the example above, impedance module 20 may provide for a −45° phase shift on RF path 1, and impedance module may provide a +45° phase shift on RF path 2. In this way, both RF path 1 and RF path 2 are in-phase when received at power combiner 25.

RF path 2 (21) has a switch 23 for selectively activating and deactivating path 2 (21). More particularly, switch 23 is arranged to receive a power mode command from a power selection circuit 22. Power selection circuit 22 may be the power management controller for a wireless mobile device, for example. It will be appreciated that other circuits may be used for selecting or setting the desired operational power mode. Typically, power selection 22 will be made between two available power modes. These power modes, which may be defined as a high mode or high power mode and low mode or a low-power mode, may be identified by other names according to the implemented communication standard. Although power selection 22 is typically made between two available power levels or modes, it will be appreciated that additional power levels may be defined according to specific application implementations.

Balanced amplifier 12 is constructed such that RF path 1 (19) is always active, while RF path 2 (21) may be on or off according to the state of switch 23. For example, when power selection 22 is set to a high power mode, switch 23 is closed so that RF path 2 (21) is active or on. However, when power selection 22 is set to low-power mode, switch 23 is set to open, thereby deactivating RF path 2 (21). A power combiner 25 receives the signal from RF path 1 and combines it with the signal from RF path 2, if any. The combined signal is then output as an amplified RF out signal 28. In one example, the power combiner 25 is a Wilkinson power combiner, which is well known in the art.

When operating in its high power mode, the impedance at point 11 is relatively low, which enables the power amplifier to generate higher output power. In high power mode, the balanced power amplifier 12 has a network topology that includes both path 1 and path 2, and specific components may be selected to form an optimum or near-optimum impedance level for point 11. These selection process are when known in amplifier design, so will not be discussed in detail.

When operating in low power mode, RF path 2 (21) has been turned off, for example, by switching off the power to Path 2's RF transistors. It will be understood that other circuits may be used to turn off or deactivate RF path 2. When path 2 (21) is turned off, the output matching network topology is significantly modified, thereby changing the impedance at point 11. By properly selecting the components and arrangement for the impedance modules, the impedance at point 11 will set to a value for highly efficient operation in the new topology. Importantly, when RF path 2 is turned off, the new output matching network topology sets a higher impedance at point 11, which enables efficient operation in the low power mode. In this way, turning off RF path 2 accomplishes two desirable results: first, the power amplifier transitions to low power operation with lower quiescent current; and second, a higher impedance is set at RF path 1 for improved low power efficiency. As a consequence, power amplifier 10 can be constructed in a small footprint with simple power control.

Figure 2:
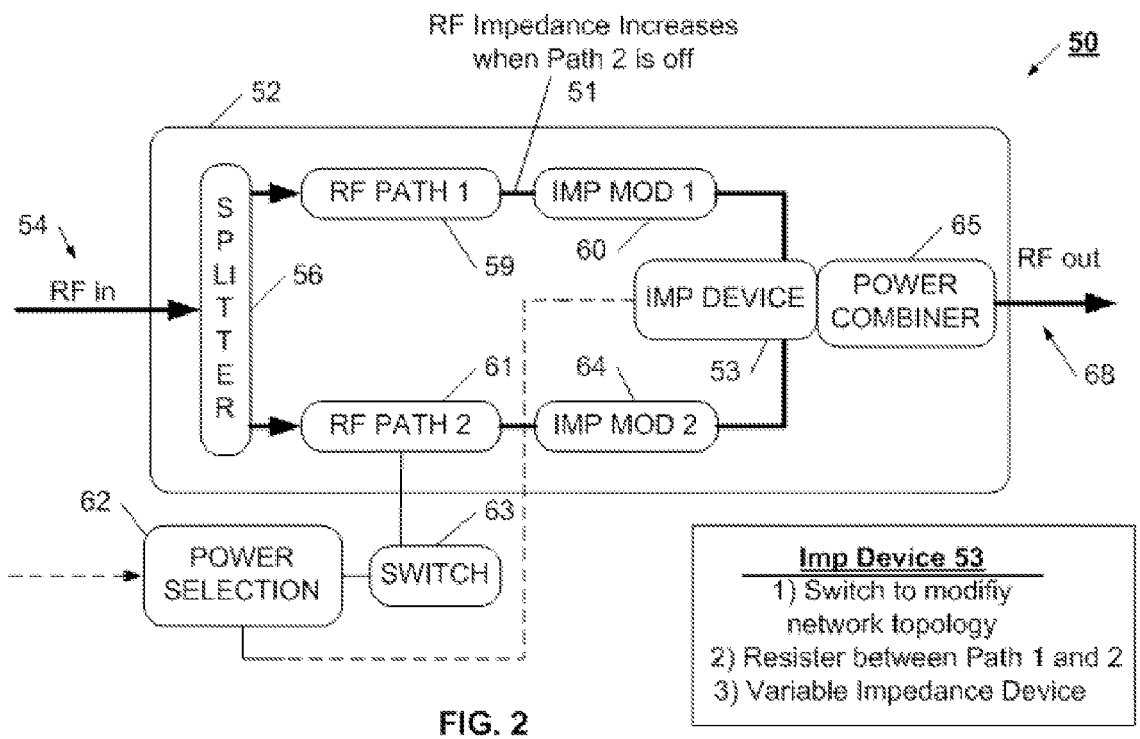
FIG. 2 is a simplified block diagram of a high efficiency load insensitive power amplifier in accordance with the present invention.

Referring now to FIG. 2, another power amplifier system 50 is illustrated. Similar to power amplifier 10, power amplifier 50 is a high efficiency load insensitive power amplifier. Although power amplifier system 50 will be described with reference to specific communication standards, it will be appreciated that power amplifier system 50 may be widely adapted to other RF devices and other communication standards. Also, power amplifier 50 is described for use with RF communication systems typically operating in the range of about 800 MHz to about 2000 MHz. It will be appreciated that simple adjustments to component selection, sizing, and placement may be made for operation at other frequencies.

Power System 50 receives an RF signal at an RF input 54. In one example, the RF input 54 is received from the output of an RF transmitter or RF transceiver. The RF input is received into the balanced amplifier 52. The balanced amplifier 52 has a splitter 56 for splitting the RF input signal 54 into a first RF path 59 and a second RF path 61. It will be appreciated that splitter 56 may be constructed to adjust the phase relationship between the output paths according to application requirements. In one example, splitter 56 may set the phase of RF Path 1 (59) to +45°, and may set the phase of RF path 2 (61) at −45°. In this way, the RF paths are initially 90° out of phase. It will be appreciated that other phase relationships may be set.

Each RF path also includes a respective impedance module. As illustrated, impedance module 1 (60) performs a phase shifting function complementary to the phase shift of RF path 1 at splitter 56, and impedance module 2 (64) also performs a phase shifting function complementary to the phase shift of RF path 2 at splitter 56. Continuing the example above, impedance module 60 may provide for a −45° phase shift on RF path 1, and impedance module may provide a +45° phase shift on RF path 2. In this way, both RF path 1 and RF path 2 are in-phase when received at impedance device 53 and power combiner 65.

RF path 2 (61) has a switch 63 for selectively activating and deactivating path 2 (61). More particularly, switch 63 is arranged to receive a power mode command from a power selection circuit 62. Power selection circuit 62 may be the power management controller for a wireless mobile device, for example. It will be appreciated that other circuits may be used for selecting or setting the desired operational power mode. Typically, power selection 62 will be made between two available power modes. These power modes, which may be defined as a high power mode and a low-power mode, may be identified by other names according to the implemented communication standard. Although power selection 62 is typically made between two available power levels or modes, it will be appreciated that additional power levels may be defined according to specific application implementations.

Balanced amplifier 52 is constructed such that RF path 1 (59) is always active, while RF path 2 (61) may be on or off according to the state of switch 63. For example, when power selection 62 is set to a high power mode, switch 63 is closed so that RF path 2 (61) is active or on. However, when power selection 62 is set to low-power mode, switch 63 is set to open, thereby deactivating RF path 2 (61).

Power selection 62 may also connect to an impedance device 53, which is set to more particularly define the network topology of the power amplifier 50 when operating in the high power mode or the low power mode. It will be appreciated that the type and complexity of the impedance device 53 may be selected according to application requirements. For example, in some cases, a separate impedance device, such as device 53, may not even be needed, as described with reference to power amplifier 10. In other cases, the impedance device may be a simple resistor that cooperates with the Wilkinson power combiner 65. In this arrangement, the resistor is sized to adjust the network topology in a way that the power combiner efficiently operates in high power mode, and also contributes to increasing the impedance at point 51 when the RF path 2 is off. When using such a passive device, no control signal is needed from the power selection 62. It will be appreciated that other passive devices may be used to adjust topology.

In another example, impedance device 53 may be an active device, such as a switch. The switch may be positioned to adjust the network topology of power amplifier 50, and more particularly, to adapt the resistance seen by the Wilkinson power combiner 65. When the power selection 62 puts the switch into a high power state, the switch may present a resistance of about 50 to 100 ohms, for example, and when the power selection 62 puts the switch into a low power state, the switch may present a much higher resistance, for example 500 or greater ohms. In this way, the power combiner maintains excellent efficiency in either power mode. It will be appreciated that other impedances may be selected for other implementations. The switch may operate alone, that is, to provide a switchable resistor, or may switch in/out another active or passive device.

In yet another example, the impedance device 53 may be a transistor, such as a JFET transistor. The transistor is switched responsive to the power selection 62, and allows a more accurate and flexible matching circuit. In one specific example, a transistor impedance device 53 may operate in high power mode with a relatively low impedance, typically around 50 to 100 ohms, and may operate in the low power state with a relatively high impedance, typically around 500 ohms or more. It will be understood that other impedances may be selected according to well known matching processes. It will also be understood that other types of transistors or active devices may be used.

A power combiner 65 cooperates with the impedance device 53 to combine the signals from RF path 1 and RF path 2 (if any). The combined signal is then output as an amplified RF out signal 68. In one example, the power combiner 65 is a Wilkinson power combiner, which is well known in the art.

When operating in its high power mode, the impedance at point 51 is relatively low, which enables the power amplifier to generate higher output power. In high power mode, the amplifier 50 has a network topology that includes both path 1, path 2, and the impedance device 53 in its high power state. It will be understood that the specific components may be selected to select an optimum or near-optimum impedance for point 51. These selection process are well known in amplifier design, so will not be discussed in detail.

When operating in low power mode, RF path 2 (61) has been turned off, for example, by switching off the power to Path 2's RF transistors or other active devices, and the impedance device operates in its low power state. It will be understood that other circuits may be used to turn off or deactivate RF path 2. When path 2 (61) is turned off and the impedance device 53 operates in its low power state, the network topology is significantly modified, thereby changing the impedance at point 51. By properly selecting the components for impedance device 53, the impedance at point 51 will set to a value for highly efficient operation in the new topology. Importantly, when RF path 2 is turned off and impedance device operates at low power, the new output matching network topology sets a higher impedance at point 51, which enables efficient operation in the low power mode. In this way, turning off RF path 2 and operating the impedance device in its low power state accomplishes two desirable results: first, the power amplifier 50 transitions to low power operation with lower quiescent current; and second, a higher impedance is set at RF path 1 for improved low power efficiency. As a consequence, power amplifier 50 can be constructed in a small footprint with simple power control.

Figure 3:
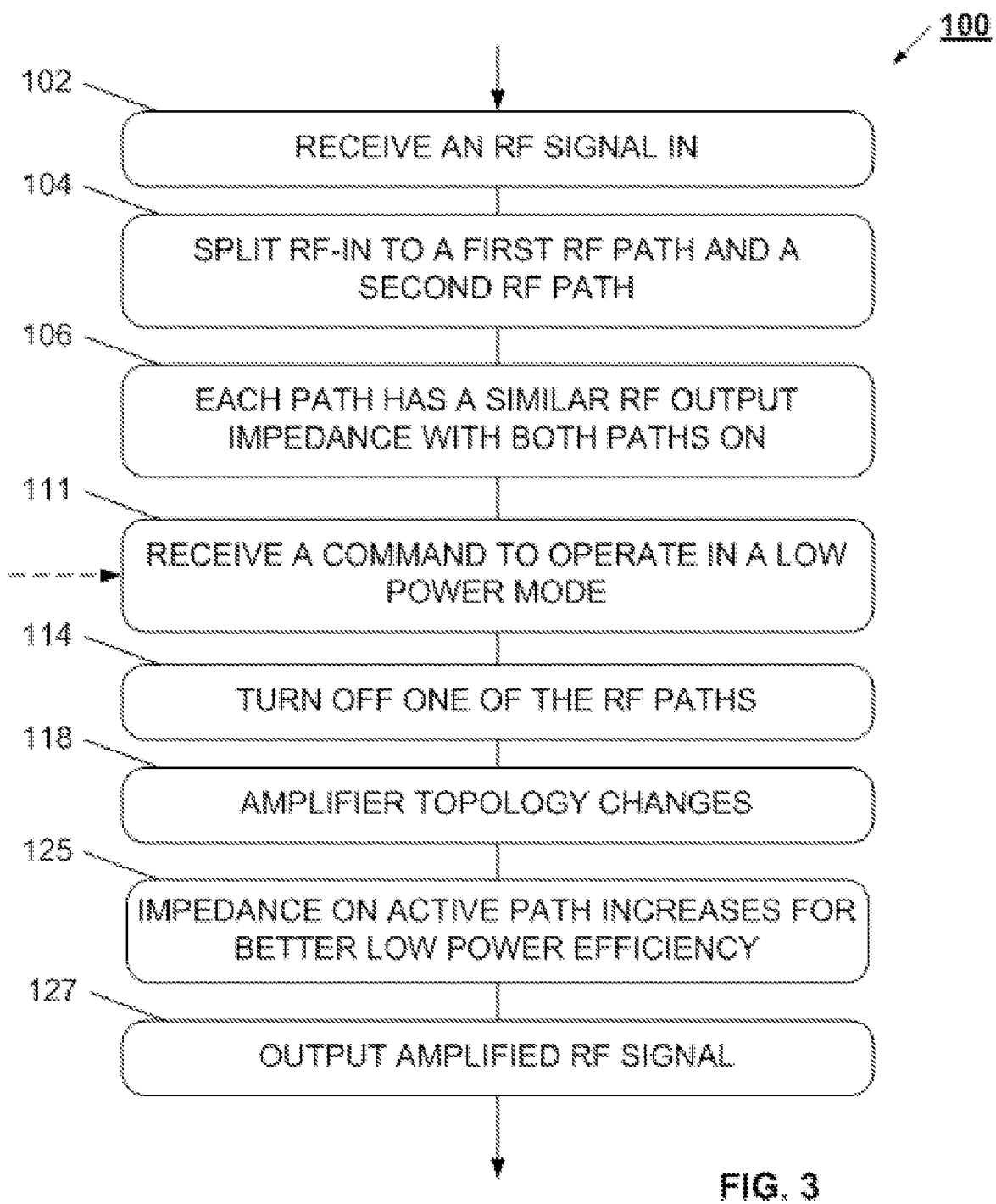
FIG. 3 is a flow chart of a process for operating a high efficiency load insensitive power amplifier in accordance with the present invention.

Referring now to FIG. 3, a flowchart of a process 100 for operating a power amplifier is illustrated. Process 100 may be advantageously operated on a power amplifier such as power amplifier 10 described with reference to FIG. 1. Process 100 receives an RF signal as shown in block 102. This RF signal may be an RF signal received from the output of an RF transmitter or RF transceiver. The RF signal may be compliant with a telecommunications standard, which may be, for example, CDMA, WCDMA, CDMA2000, GSM, EDGE, GPRS, PHS, or other known or evolving communication standard. The received RF signal is split into a first RF path and a second RF path as shown in block 104. In this way, the RF signal has been divided for operation in a balanced amplifier system. Each path has components sized and selected so that each path has a similar RF output impedance as shown in block 106. The two paths also cooperate to act as a highly efficient balanced amplifier. The power amplifier may operate in a high power mode, where both RF paths remained active. The RF signals are combined and output as an amplified RF signal.

From time to time it may be desirable to operate the power amplifier in a low-power mode. In such a case, a power-select command is received in block 111 to have the power amplifier transition to a low-power mode. Responsive to the command, one of the RF paths is deactivated or turned off as shown in block 114. It will be appreciated that the path may be completely deactivated, or just highly attenuated. With one of the RF paths off, the network topology for the power amplifier also changes, as shown in block 118. Accordingly, impedances throughout the power amplifier may also change. Advantageously, the construction of the power amplifier causes the impedance of the active path to increase responsive to the topology change, as shown in block 125. This increased impedance in turn allows the power amplifier to operate with increased efficiency when outputting an amplified RF signal, as shown in block 127.

Figure 4:
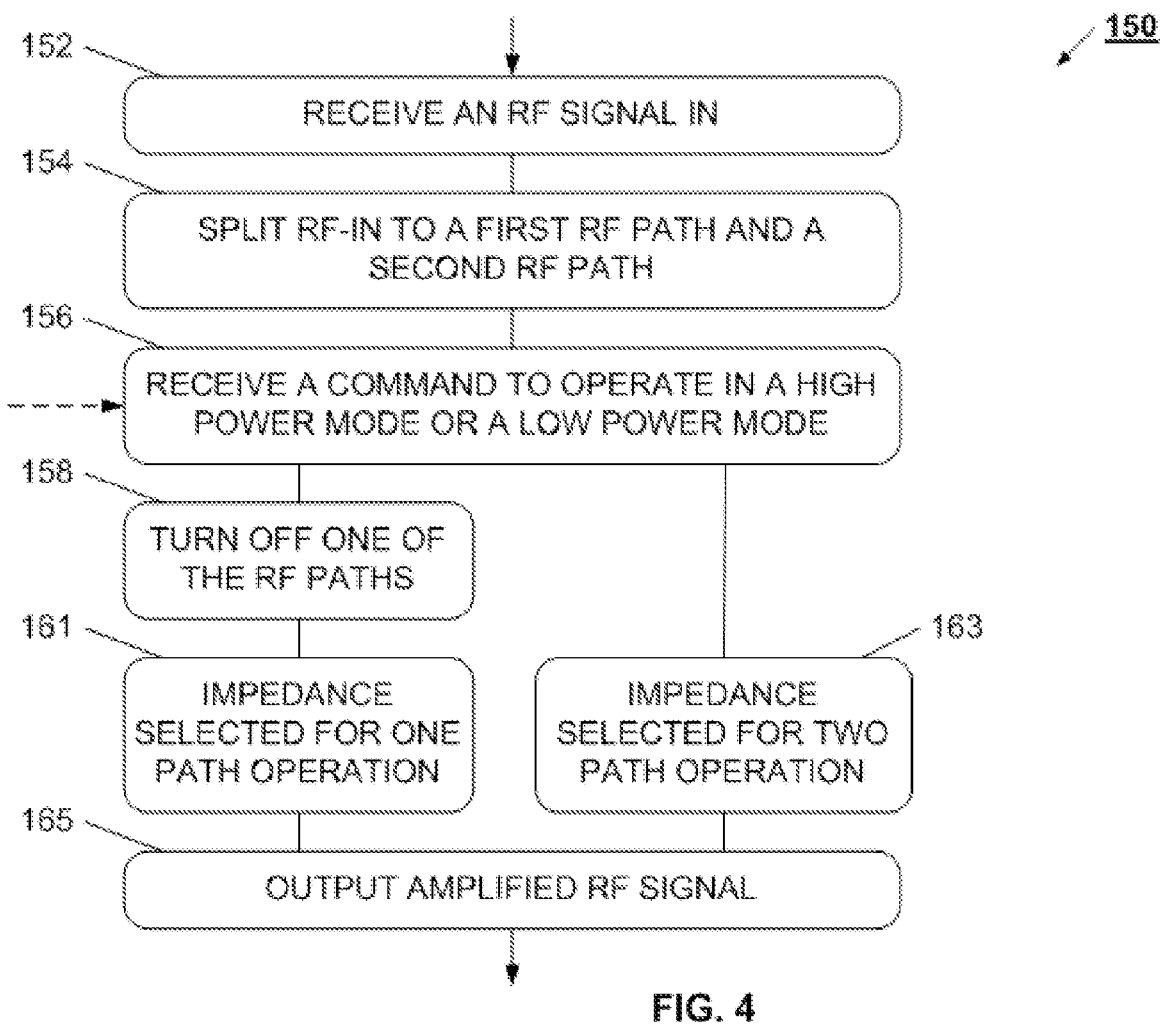
FIG. 4 is a flow chart of a process for operating a high efficiency load insensitive power amplifier in accordance with the present invention.

Referring now to FIG. 4, a flowchart of a process for operating a power amplifier is illustrated. Process 150 may be advantageously operated on a power amplifier such as power amplifier 50 described with reference to FIG. 2. Process 150 receives an RF signal as shown in block 152. This RF signal may be an RF signal received from the output of an RF transmitter or RF transceiver. The RF signal may be compliant with a telecommunications standard, which may be, for example, CDMA, WCDMA, CDMA2000, GSM, EDGE, GPRS, PHS, or other known or evolving communication standard. The received RF signal is split into a first RF path and a second RF path as shown in block 154. In this way, the RF signal has been divided for operation in a balanced amplifier system. A power-select command is received in block 156 to have the power amplifier operate in either a high power mode or a low-power mode. If the command sets a low-power mode, one of the RF paths is deactivated or turned off as shown in block 158. It will be appreciated that the path may be completely deactivated, or just highly attenuated. If the high power mode is selected, both RF paths remained active. An impedance device also sets a matching impedance depending on whether one path or two paths are active as shown in blocks 161 and 163. This impedance device may be selected according to application needs, and may be, for example, a resistor, a variable resistor, a switched passive device, or an active device. In the case of active devices, the impedance device also acts responsive to the power-select command. The available RF signals are combined as shown in block 165, and output as an amplified RF signal.

Figure 5:
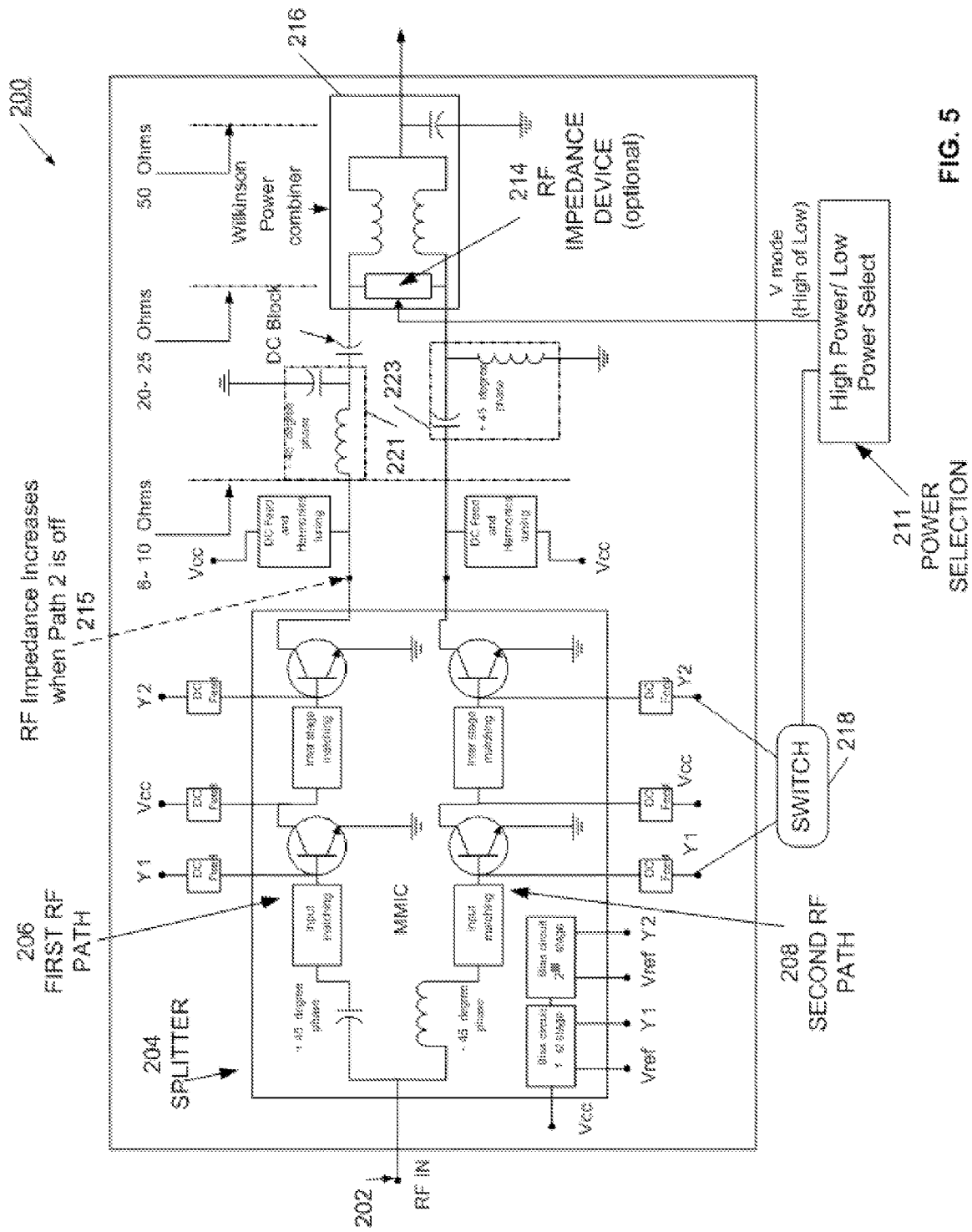
FIG. 5 is a circuit and block diagram of a high efficiency load insensitive power amplifier in accordance with the present invention.

Referring now to FIG. 5, another power amplifier system 200 is illustrated. Similar to power amplifiers 10 and 50, power amplifier 200 is a high efficiency load insensitive power amplifier. Although power amplifier system 200 will be described with reference to specific communication standards, it will be appreciated that power amplifier system 200 may be widely adapted to other RF devices and other communication standards. Also, power amplifier 200 is described for use with RF communication systems typically operating in the range of about 800 MHz to about 2000 MHz. It will be appreciated that simple adjustments to component selection, sizing, and placement may be made for operation at other frequencies.

Power System 200 receives an RF signal at an RF input 202. In one example, the RF input 54 is received from an RF transmitter or RF transceiver. The RF input is received into the balanced amplifier 52. The balanced amplifier 202 has a splitter 204 for splitting the RF input signal 202 into a first RF path 206 and a second RF path 208. It will be appreciated that splitter 204 may be constructed to adjust the phase relationship between the output paths according to application requirements. In one example, splitter 204 may set the phase of RF Path 1 (206) to +45°, and may set the phase of RF path 2 (208) at −45°. In this way, the RF paths are initially 90° out of phase. It will be appreciated that other phase relationships may be set.

Each RF path also includes a respective impedance module. As illustrated, impedance module 1 (221) performs a phase shifting function complementary to the phase shift of path 1 input splitter, and impedance module 2 (223) also performs a phase shifting function complementary to the phase shift of path 2 input splitter. Continuing the example above, impedance module 221 may provide for a −45° phase shift on RF path 1, and impedance module 223 may provide a +45° phase shift on RF path 2. In this way, both RF path 1 and RF path 2 are in-phase when received at impedance device 214 and power combiner 216.

RF path 2 (208) has a switch 218 for selectively activating and deactivating path 2 (208). More particularly, switch 218 is arranged to receive a power mode command from a power selection circuit 211. Power selection circuit 211 may be or connect to power management controller for a wireless mobile device, for example. It will be appreciated that other circuits may be used for selecting or setting the desired operational power mode. Typically, power selection 211 will be made between two available power modes. These power modes, which may be defined as a high power mode and a low-power mode, may be identified by other names according to the implemented communication standard. Although power selection 211 is typically made between two available power levels or modes, it will be appreciated that additional power levels may be defined according to specific application implementations.

Balanced amplifier 200 is constructed such that RF path 1 (206) is always active, while RF path 2 (208) may be on or off according to the state of switch 218. For example, when power selection 211 is set to a high power mode, switch 218 is closed so that RF path 2 (208) is active or on. However, when power selection 211 is set to low-power mode, switch 218 is set to open, thereby deactivating RF path 2 (208).

Power selection 211 may also connect to an impedance device 214, which is set to more particularly define the network topology of the power amplifier 200 when operating in the high power mode or the low power mode. It will be appreciated that the type and complexity of the impedance device 214 may be selected according to application requirements. For example, in some cases, a separate impedance device, such as device 214, may not even be needed, as described with reference to power amplifier 10. In other cases, the impedance device may be a simple resistor that cooperates with the Wilkinson power combiner 216. In this arrangement, the resistor is sized to adjust the network topology in a way that the power combiner efficiently operates in high power mode, and also contributes to increasing the impedance at point 215 when the RF path 2 (208) is off. When using such a passive device, no control signal is needed from the power selection 211. It will be appreciated that other passive devices may be used to adjust topology.

In another example, impedance device 214 may be an active device, such as a switch. The switch may be positioned to adjust the network topology of power amplifier 200, and more particularly, to adapt the resistance seen by the Wilkinson power combiner 216. When the power selection 211 puts the switch into a high power state, the switch may present a resistance of about 50 to 100 ohms, for example, and when the power selection 211 puts the switch into a low power state, the switch may present a much higher resistance, for example 500 ohms. In this way, the power combiner maintains excellent efficiency in either power mode. The switch may operate alone, that is, to provide a switchable resistor, or may switch in/out another active or passive device.

In yet another example, the impedance device 214 may be a transistor, such as a JFET transistor. The transistor is switched responsive to the power selection 211, and allows a more accurate and flexible matching circuit. In one specific example, a transistor impedance device 214 may operate in high power mode with a relatively low impedance, typically around 50 to 100 ohms, and may operate in the low power state with a relatively high impedance, typically around 500 ohms. It will be understood that other impedances may be selected according to well known matching processes. It will also be understood that other types of transistors or active devices may be used.

A power combiner 216 cooperates with the impedance device 214 to combine the signals from RF path 1 and RF path 2 (if any). The combined signal is then output as an amplified RF out signal. In one example, the power combiner 216 is a Wilkinson power combiner, which is well known in the art.

When operating in its high power mode, the impedance at point 215 is relatively low, which enables the power amplifier to generate higher output power. In high power mode, the power amplifier 200 has a network topology that includes RF path 1 (206), RF path 2 (208), and the impedance device 214 in its high power state. It will be understood that the specific components may be selected to select an optimum or near-optimum impedance level for point 215. These selection process are when known in amplifier design, so will not be discussed in detail.

When operating in low power mode, RF path 2 (208) has been turned off, for example, by switching off the power to path 2's RF transistors, and the impedance device operates in its low power state. It will be understood that other circuits may be used to turn off or deactivate RF path 2 (208). When path 2 (208) is turned off and the impedance device 214 operates in its low power state, the output matching network topology is significantly modified, thereby changing the impedance at point 215. By properly selecting the components for impedance device 214, the impedance at point 215 will set to a value for highly efficient operation in the new topology. Importantly, when RF path 2 (208) is turned off and impedance device 214 operates at low power, the new topology sets a higher impedance at point 215, which enables efficient operation in the low power mode. In this way, turning off RF path 2 and operating the impedance device in its low power state accomplishes two desirable results: first, the power amplifier 200 transitions to low power operation with low quiescent current; and second, a higher impedance is set at RF path 1 for improved low power efficiency. As a consequence, power amplifier 200 can be constructed in a small footprint with simple power control.

Figure 6:
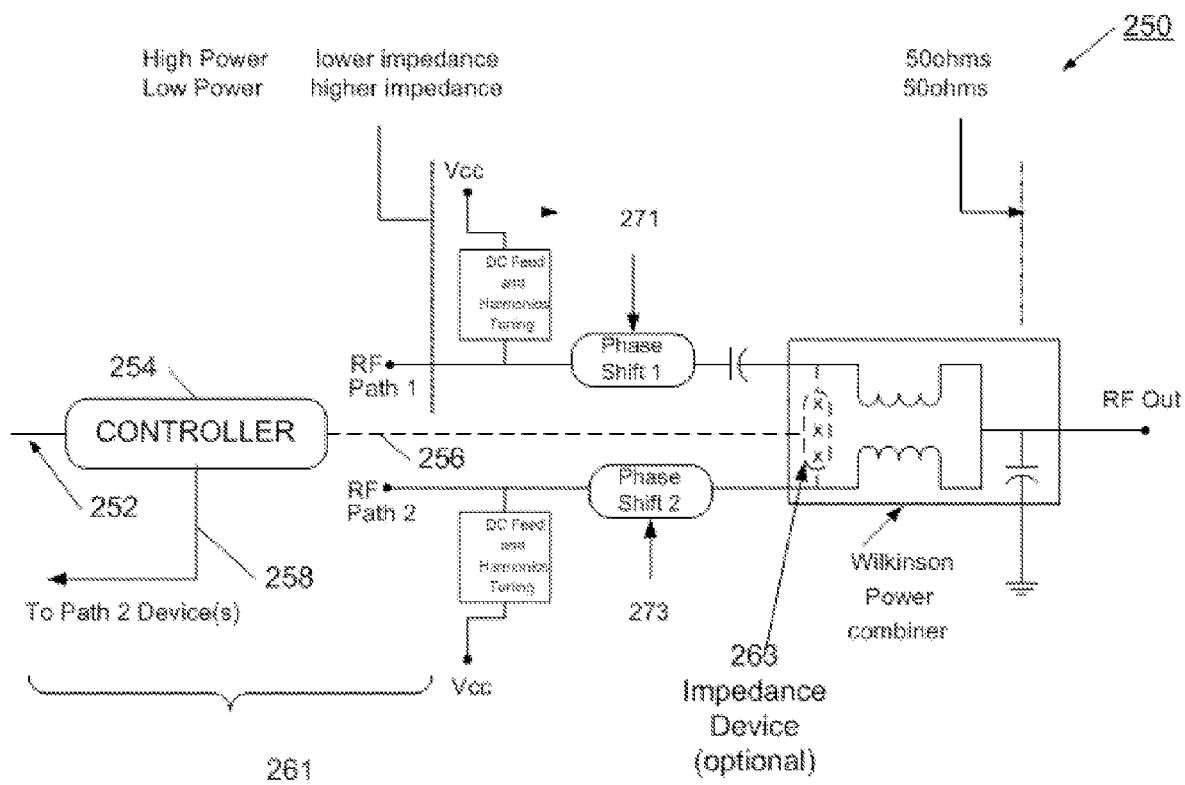
FIG. 6 is a circuit and block diagram of a power selection circuit for a high efficiency load insensitive power amplifier in accordance with the present invention

Referring to circuit 250 illustrated in FIG. 6, an example of a power mode selection module and an impedance device 263 is illustrated. Circuit 250 may be advantageously used in a power amplifier system, such as power amplifier system 200 illustrated with reference to FIG. 5. It will be appreciated that circuit 250 may be implemented using a variety of specific components, architectures, and device arrangements. However, circuit 250 has been found to provide a particularly compact and efficient component arrangement.

Circuit 250 has a power mode selection module 261 with a controller 254 that receives a power-mode command 252 from another module within a mobile device. Alternatively, controller 254 may generate a power-mode command responsive to other inputs or algorithmic processes. When controller 254 receives or generates a high-power command, it causes line 258 to keep both RF path 1 and RF path 2 in their "on" or active states. Also, if the impedance device is an active device, the controller may send a signal 256 to impedance device 263 to set the impedance device into its high-power state. In this state, the impedances for the RF paths are set for high efficiency operation in high power mode as previously described. When controller 254 receives or generates a low-power command, it causes line 258 to disable or turn off RF path 2, and keep only path 1 in its "on" or active states. Also, if the impedance device 263 is an active device, the controller may send a signal 256 to impedance device 263 to set the impedance device into its low-power state. In this state, the impedances for RF path 1 is set for high efficiency operation in low-power mode as previously described.

Circuit 250 has a phase shifter 271 in RF path 1 and a phase shifter 273 in RF path 2. Phase shifter 271 is arranged to complement a previous phase shift on RF path 1, and phase shifter 273 is arranged to complement a previous phase shift on RF path 2. In one construction, phase shifter 271 provides a negative phase shift, and phase shifter 273 provides a positive phase shift of equal magnitude. In a particular design, when RF path 2 is off, the components of phase shifter 273 cooperate with other active and passive components in the power amplifier to have a network topology that increases the impedance in RF path 1.

Impedance device 263 is selected according to specific application needs, including efficiency, footprint, and cost considerations. For example, in some cases, no impedance device 263 is needed as the output impedance for Path 1 sufficiently increases responsive to turning path 2 off. In this way, turning off path 2 acts to set the power amplifier into low-power operation, as well as increase the impedance for increased low-power efficiency. For more flexibility and more accurate tuning, a passive or active impedance device may be added. A passive device, such as a resistor, may be used to adjust network topology. Active devices, which change state responsive to a command from controller 254, may provide further flexibility and tuning. These active devices may include a switchable resistor, switch, transistor, variacs, or tunable ferro-electric material, for example.

It will be appreciated that the specific impedance values for impedance device 263 will be set according to the impedance matching requirements for when both RF paths are used (in high power mode) and for when only one RF path is used (in low-power mode). It will also be understood that additional impedance values may be set if more than two power modes are needed. It will also be understood that certain engineering trade-offs may be made in setting the specific impedance values. For example, some efficiency may be sacrificed in one or both of the operational modes to obtain improved isolation or other characteristic.

Figure 7:
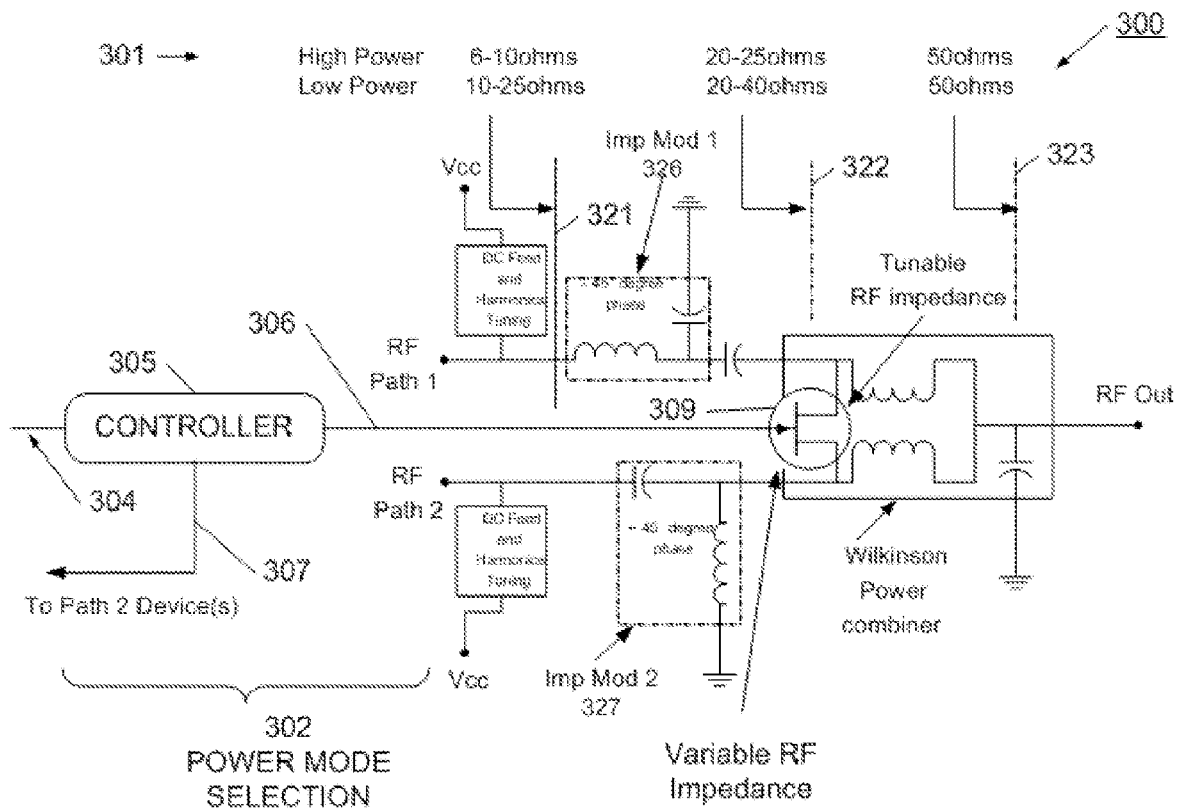
FIG. 7 is a circuit and block diagram of a power selection circuit for a high efficiency load insensitive power amplifier in accordance with the present invention.

Referring to circuit 300 illustrated in FIG. 7, an example of a power mode selection module and an impedance device 309 is illustrated. Circuit 300 may be advantageously used in a power amplifier system, such as power amplifier system 200 illustrated with reference to FIG. 5. It will be appreciated that circuit 300 may be implemented using a variety of specific components, architectures, and device arrangements. However, circuit 300 has been found to provide a particularly compact and efficient component arrangement.

Circuit 300 has a power mode selection module 302 with a controller 305 that receives a power-mode command 304 from another module within a mobile device. Alternatively, controller 305 may generate a power-mode command responsive to other inputs or algorithmic processes. When controller 305 receives or generates a high-power command, it causes line 307 to keep both RF path 1 and RF path 2 in their "on" or active states. Also, if the impedance device is an active device, the controller may send a signal 307 to impedance device 309 to set the impedance device into its high-power state. In this state, the impedances for the RF paths are set for high efficiency operation in high power mode as previously described. When controller 305 receives or generates a low-power command, it causes line 307 to disable or turn off RF path 2, and keep only path 1 in its "on" or active states. Also, if the impedance device is an active device, the controller may send a signal 306 to impedance device 309 to set the impedance device into its low-power state. In this state, the impedances for RF path 1 is set for high efficiency operation in low-power mode as previously described.

Circuit 300 has a phase shifter 326 in RF path 1 and a phase shifter 327 in RF path 2. Phase shifter 326 is arranged to complement a previous phase shift on RF path 1, and phase shifter 327 is arranged to complement a previous phase shift on RF path 2. In one construction, phase shifter 326 provides a negative phase shift, and phase shifter 327 provides a positive phase shift of equal magnitude. In a particular design, when RF path 2 is off, the components of phase shifter 327 cooperate with other active and passive components in the power amplifier to have a network topology that increases the impedance in RF path 1. As illustrated, phase shifter 327 has a capacitor in series with RF path 2, and an inductor connected to ground. By contrast, phase shifter 321 has an inductor in series with RF path 1, and a capacitor connected to ground. When RF path 2 is off, the disabled path 2 components cause a change to the network topology for RF path 1, and with properly selected components, an increase in RF path 1 impedance. For example, the table 301 shows that in high power mode (both RF paths on), the impedance at point 321 typically is about 6-10 ohms, the impedance at point 322 is typically about 20-25 ohms, and the impedance at point 323 is about 50 ohms. When put in low power mode, the impedance on RF path one is increased so that the impedance at point 321 typically is about 10-25 ohms. This approximate doubling of the impedance at the output of the second stage RF transistor causes a substantial increase in the efficiency of RF path 1. The impedance at point 322 also increases, while the overall output impedance point 323 remains about the same.

Impedance device 309 is illustrated as a JFET transistor that acts responsive to the command signal 306 from controller 305. When controller 305 is set to command a high power state, both RF path 1 and RF path 2 are active, and the JFET is set to have an RF impedance of about 50 to 100 ohms. It will be understood that other impedance values may be set according to the network topology for when both RF paths are active. When controller 305 is set to command a low power state, RF path 2 is off, only RF path 1 is active, and the JFET is set to have an RF impedance of more than about 500 ohms. It will be understood that other impedance values may be set according to the network topology for when only RF path 1 is active.

It will be appreciated that the specific impedance values for impedance device 309 will be set according to the impedance matching requirements for when both RF paths are used (in high power mode) and for when only one RF path is used (in low-power mode). It will also be understood that additional impedance values may be set if more than two power modes are needed. It will also be understood that certain engineering trade-offs may be made in setting the specific impedance values. For example, some efficiency may be sacrificed in one or both of the operational modes to obtain improved isolation or other characteristic.

An Example Power Amplifier for WCDMA

A compact handset front-end module (FEM) is developed for the third generation wide band CDMA application in PCS band. It operates at high and low power modes for good PAE (Power Amplifier Efficiency) and linearity. The low mode PAE is enhanced using analog bias control circuit. The FEM is optimized for low output power variation under mismatch load. It has extremely good ruggedness. It performs very well over temperature and has >55 dB Tx-to-Rx isolation.

Figure 8:
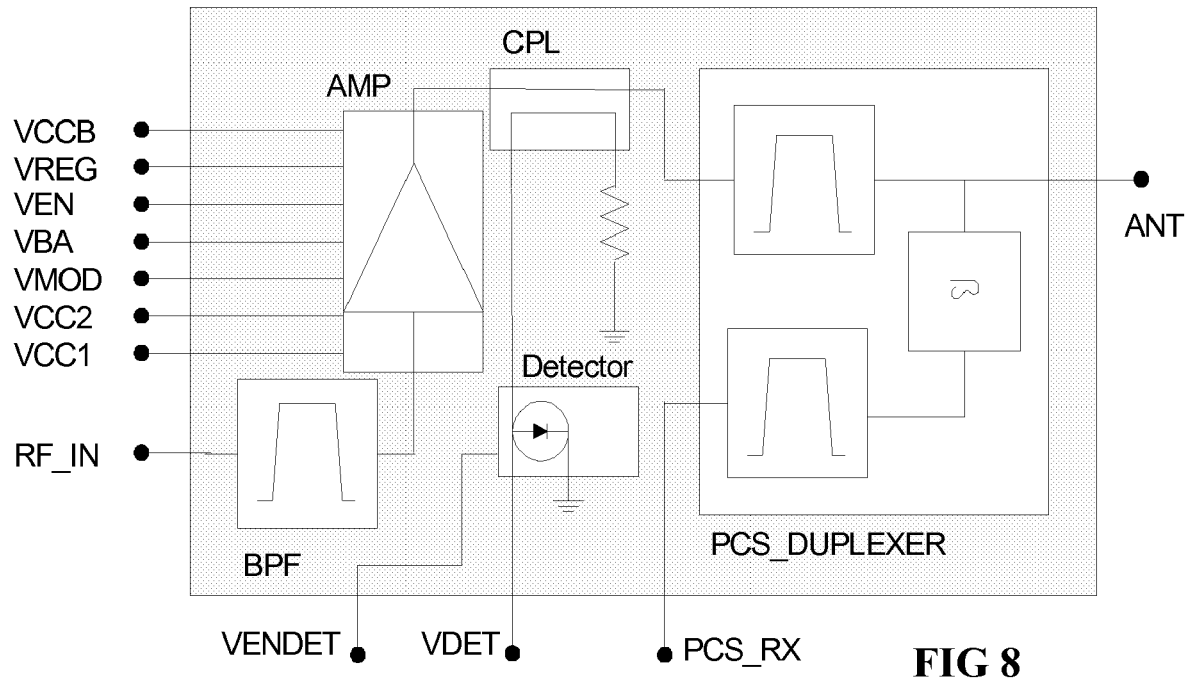

Wide-band CDMA (W-CDMA) is one of the third generation (3G) mobile communication standards, which is driven by higher data rate applications such as data and video transmission. One of key components in the WCDMA system is its power amplifier or front end module. It requires high linearity, good PAE and excellent ruggedness. Its size and cost are also important. The integration of a power amplifier with filtering elements and other required components in a single package helps to enhance its performance, reduce the module size and its overall cost. An important considering in the single package integration is the interaction between the power amplifier and its associated components, especially the leakage from Tx to Rx port. The example power amplifier system includes an input filter, a switched LIPA (Load Insensitive Power Amplifier), a coupler detector and an output duplexer. These components and others are assembled on a multi-layer laminate with total size of only about 5 mm×8 mm. The amplifier system operates at high power mode with both PA (Power Amplifier) channels (RF amplification paths) on, or at low power mode with only one PA channel on and the other one off. This path selection structure greatly improves low mode PAE. An analog bias control circuit is applied to further improve its PAE at low power levels. FIG. 8 shows a block diagram of the power amplifier system. This system can deliver output power of up to about 24 dBm at high mode and up to about 16 dBm at low mode, using 3.4V power supply. The total current consumptions are 460 mA @24 dBm and 130 mA @16 dBm, respectively. At 108 dBm in low mode, it draws less than 65 mA total current. Under WCDMA (3GPP FDD) modulation, it maintains excellent linearity with adjacent channel leakage ratio (ACPR1) of −40 dBc or better measured at 5 MHz frequency offset at all power levels. It maintains very good performance under load mismatch conditions. Under 2.5:1 load VSWR @all angles and 24 dBm output power, the module draws no more than about 500 mA with ACPR1 of −36 dBc, the worst case. The output power only varies +/−0.6 dB for constant detector voltage. The FEM has Tx to Rx isolation of >55 dB. It also has temperature compensation with total gain variation of +/−1.5 dB and power detector error of +/−0.4 dB from −20 to 85 C. This module design involves three primary elements: power amplifier, a coupler with power detector, and a duplexer.

Figure 9:
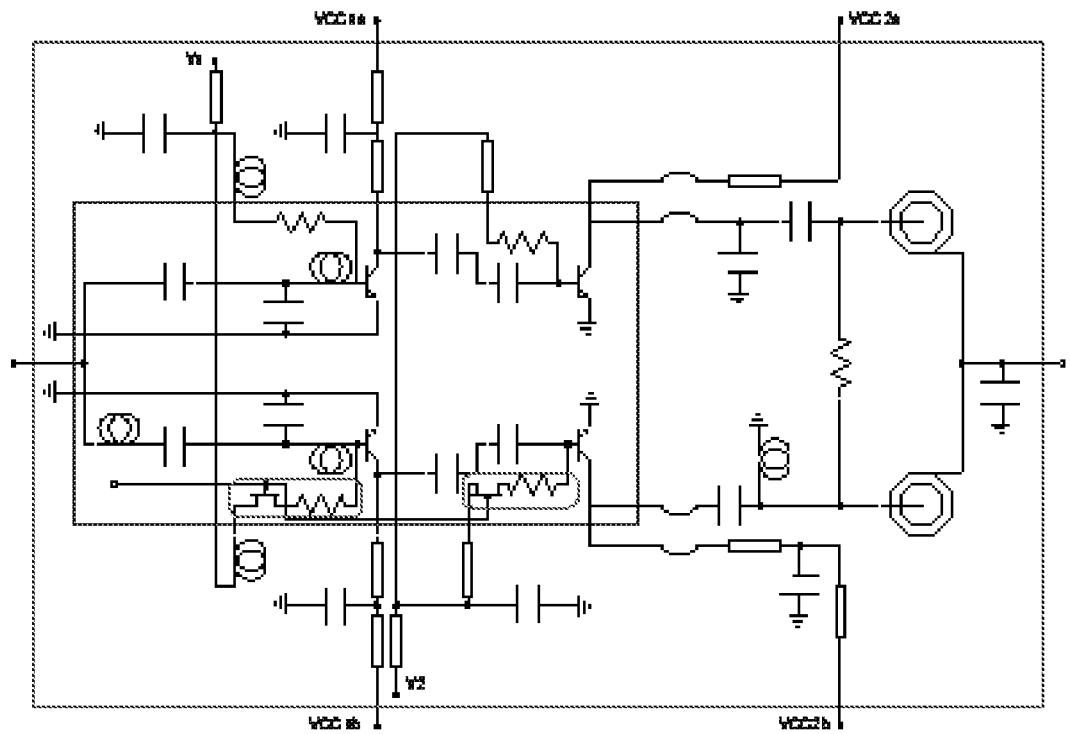
Figure 10A:
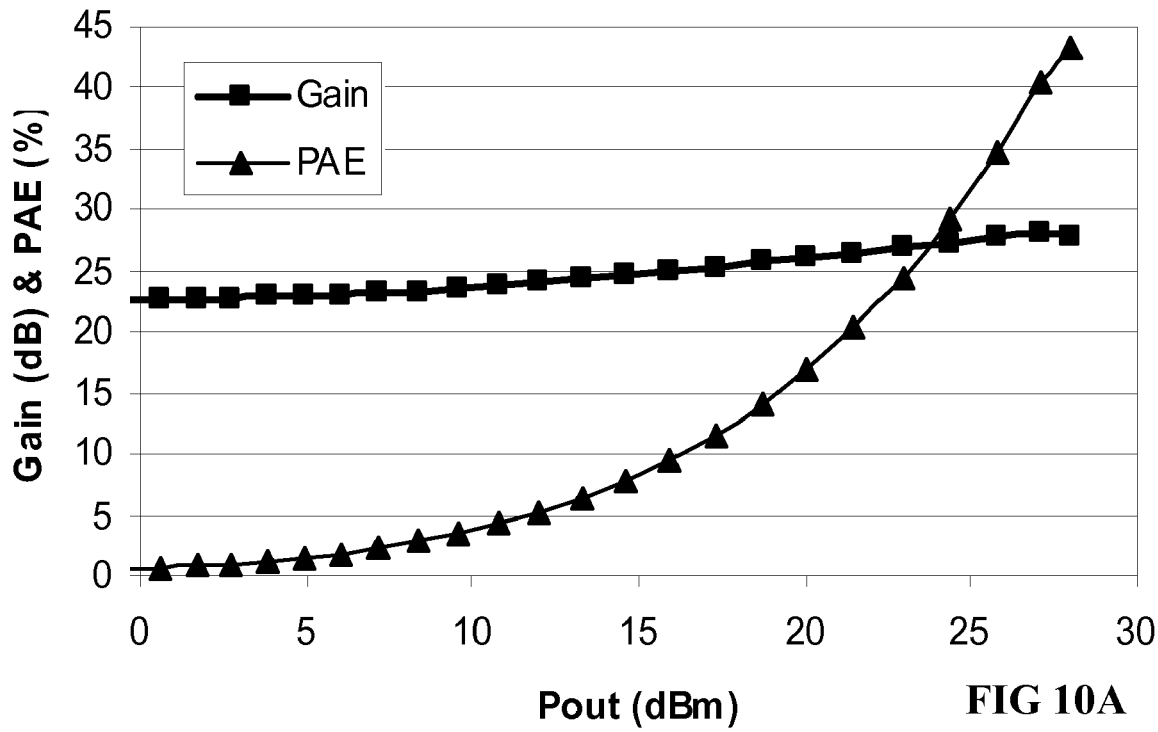
FIG. 10a: Simulated Gain and PAE at high mode
Figure 10B:
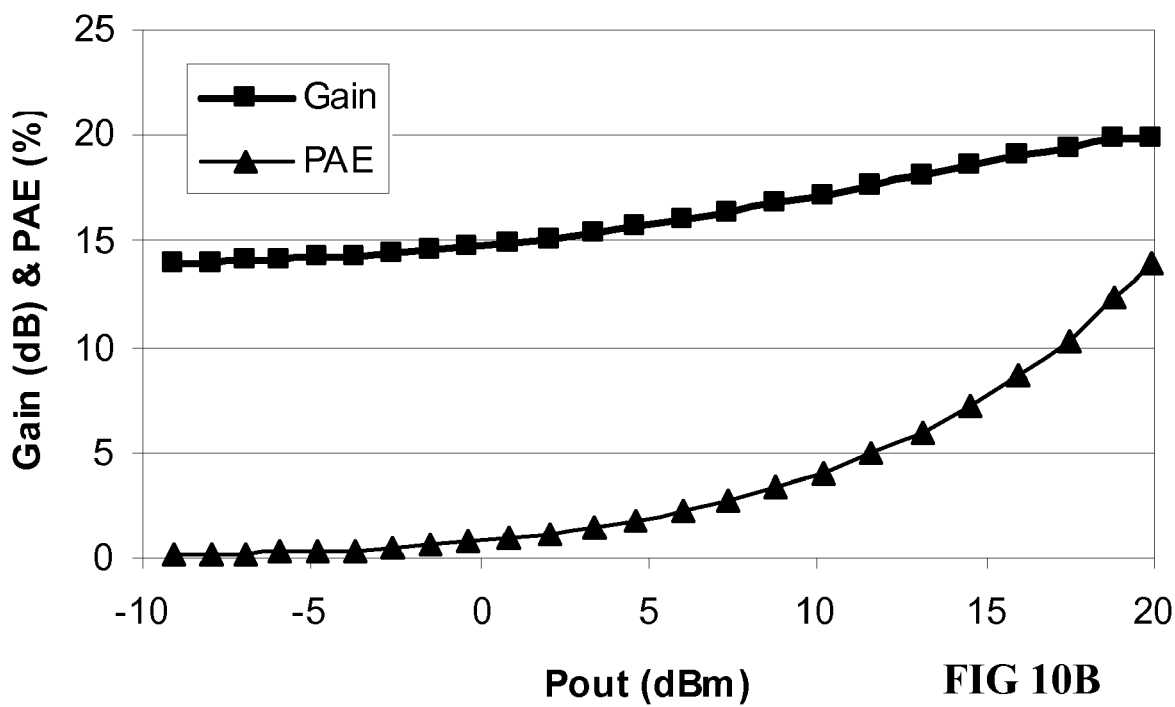
FIG. 10b: Simulated Gain and PAE at low mode
Figure 11:
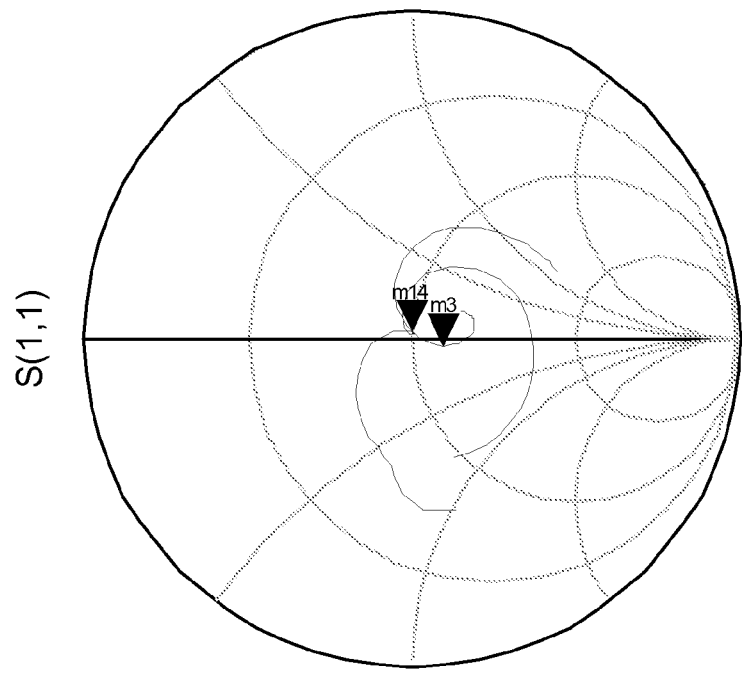

Power Amplifier Design. The power amplifier has been designed and constructed for good linearity and PAE, with consideration for high yield and low cost manufacturing. FIG. 9 shows a schematic of an example switched LIPA. It is a two stage power amplifier with an upper side path and a lower side path. An input RF signal is split and fed to upper and lower PA chains (paths), and then combined at the output using a Wilkinson combiner. Both input and output matching networks of both PA channels have a phase shifter built into the matching circuit. Input and inter-stage matching networks are on chip; while output matching network is off-chip. Lower side PA chain (path) can be switched off when it operates at low power mode. The output matching network transfers 50 ohm to around 6 ohm at each side of the PA output when it works in high power mode and to around 25 ohm at the upper side of the PA output in low power mode. Thus, PAE is significantly improved in low power mode. Analog bias control circuitry is introduced to adjust quiescent current for different power levels in low mode. The LIPA is set to operate in class AB mode. By setting the two stage PA quiescent current properly, the amplifier achieves good linearity and PAE at the same time. The harmonic balance simulation results for gain and PAE are shown in FIGS. 10*a* and 10*b* for high mode and low mode, respectively. The input match simulation result is shown in FIG. 11.

Figure 12:
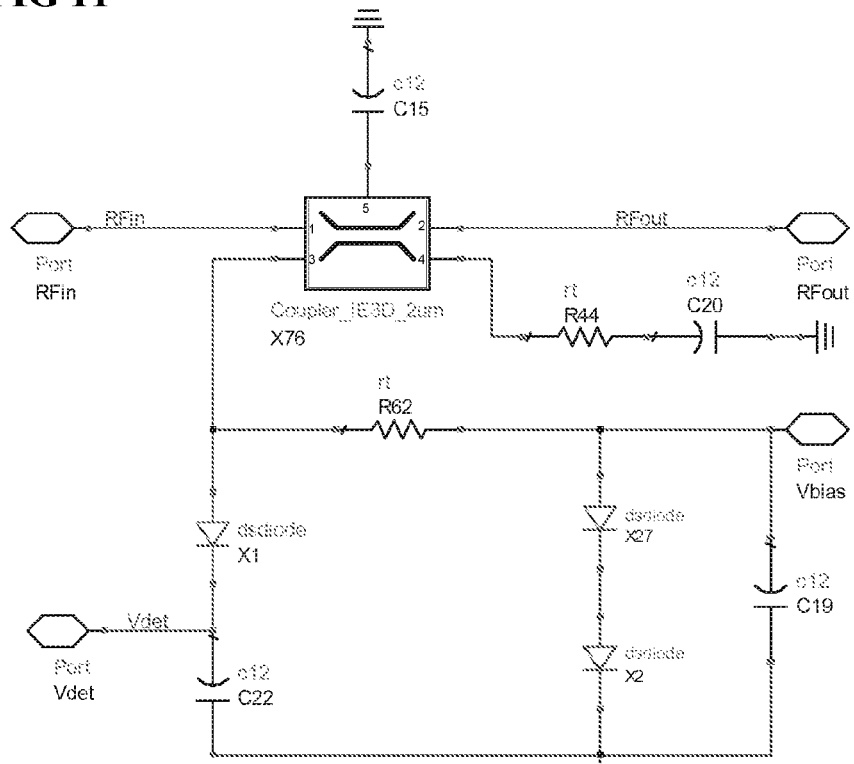
Figure 13:
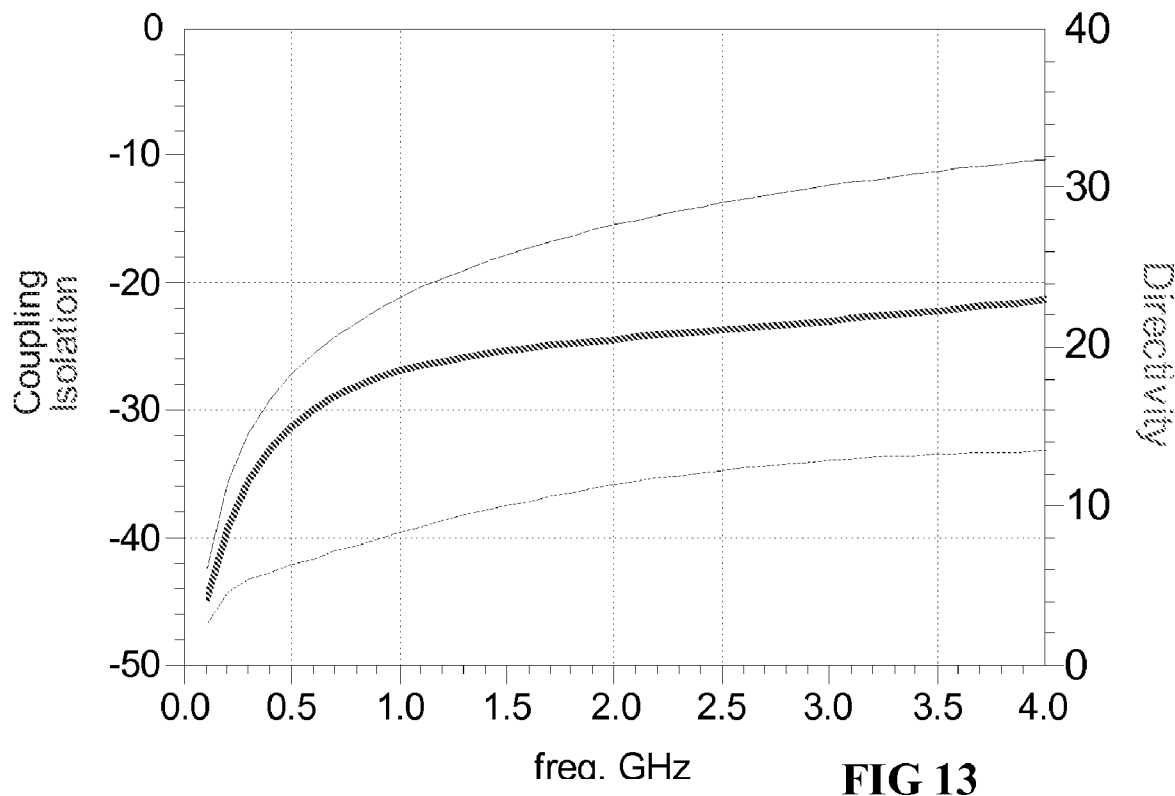
Figure 14:
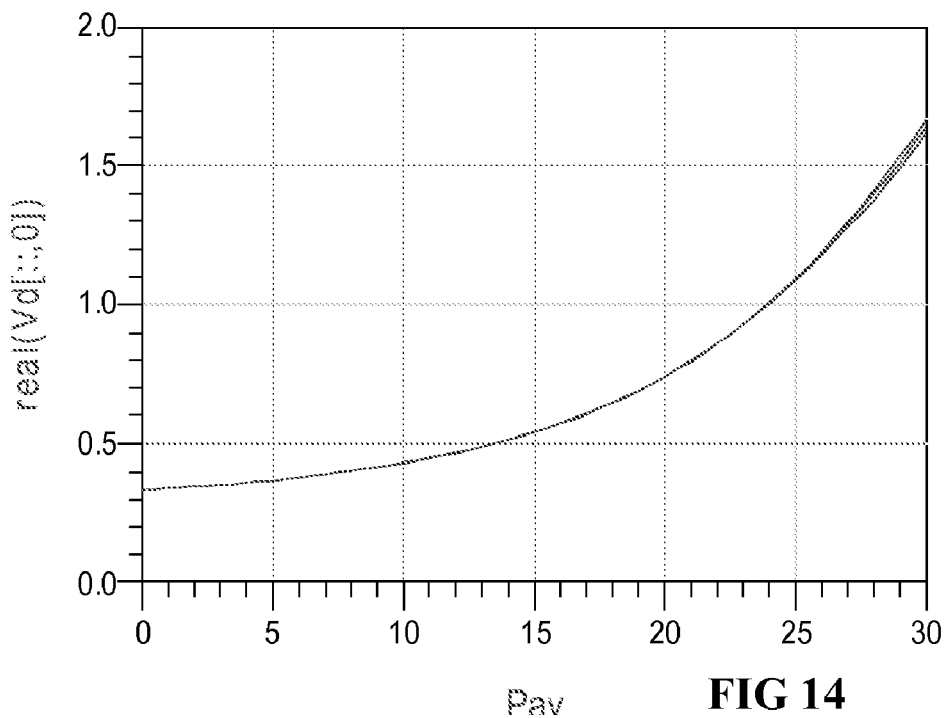

Coupler and Detector Circuit Design. FIG. 12 shows a schematic of the coupler plus detector circuit. An edge coupled microstrip line coupler is used. A schottky detector diode is connected at the coupling port. Another two diodes in series are used for temperature compensation. The detector bias circuit is designed to make sure the detector has enough sensitivity at specified minimum RF power level. Also, it ensures the whole detector draws very low current in standby or off mode. EM simulation result of the coupler is shown in FIG. 13. The results indicate about 14 dB coupling factor and 25 dB directivity at 1880 MHz, the center of PCS band (1850-1910 MHz). Harmonic balance simulation was implemented for the coupler and detector circuit. Its over temperature result is illustrated in FIG. 14. From the result, it can be seen that the detector voltage variation over temperature was compensated very well.

Output Duplexer Design. The duplexer applied in this example has a Tx filter, an Rx filter and a delay line. Its block diagram is shown in FIG. 8. The delay line is used to ensure that Rx filter plus delay lime presenting to the Tx output port is an open circuit at Tx frequencies. The Rx filter uses bulk acoustic wave (BAW) technology; while the Tx filter uses SAW technology. The latter one features temperature compensation, which enhances the FEM performance at corner frequencies over temperature. In order to have good isolation between Tx input and Rx output, the grounding of Tx and Rx filters and shielding of delay line is assured.

Figure 15:
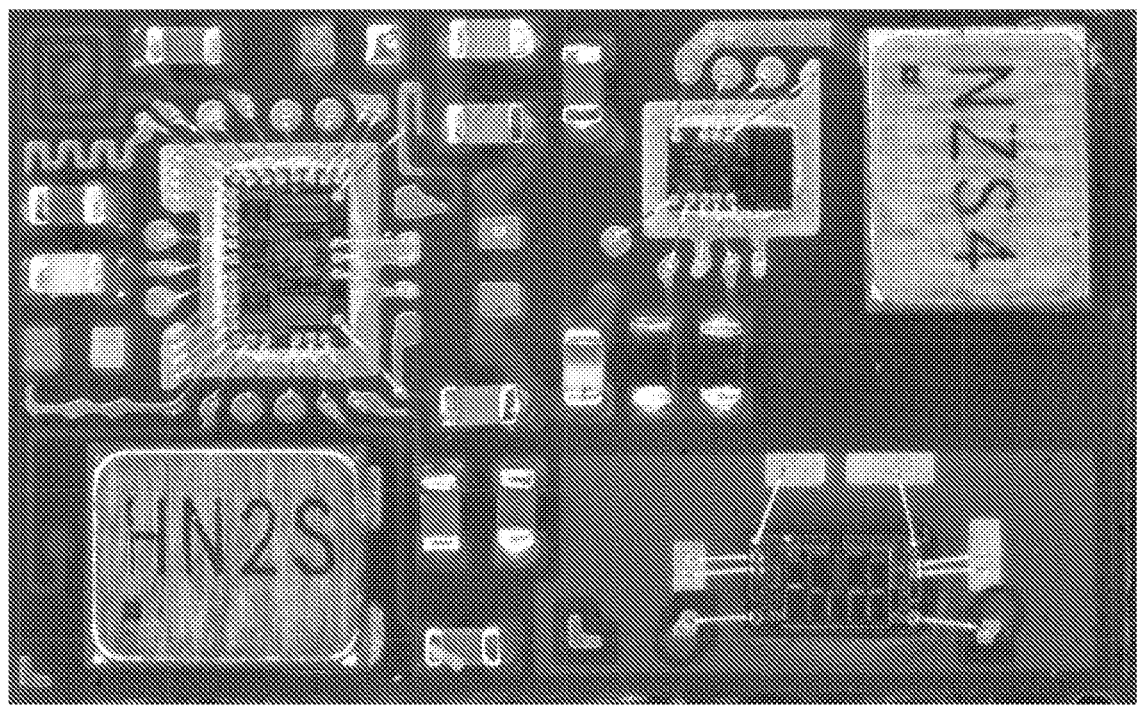
Figure 16A:
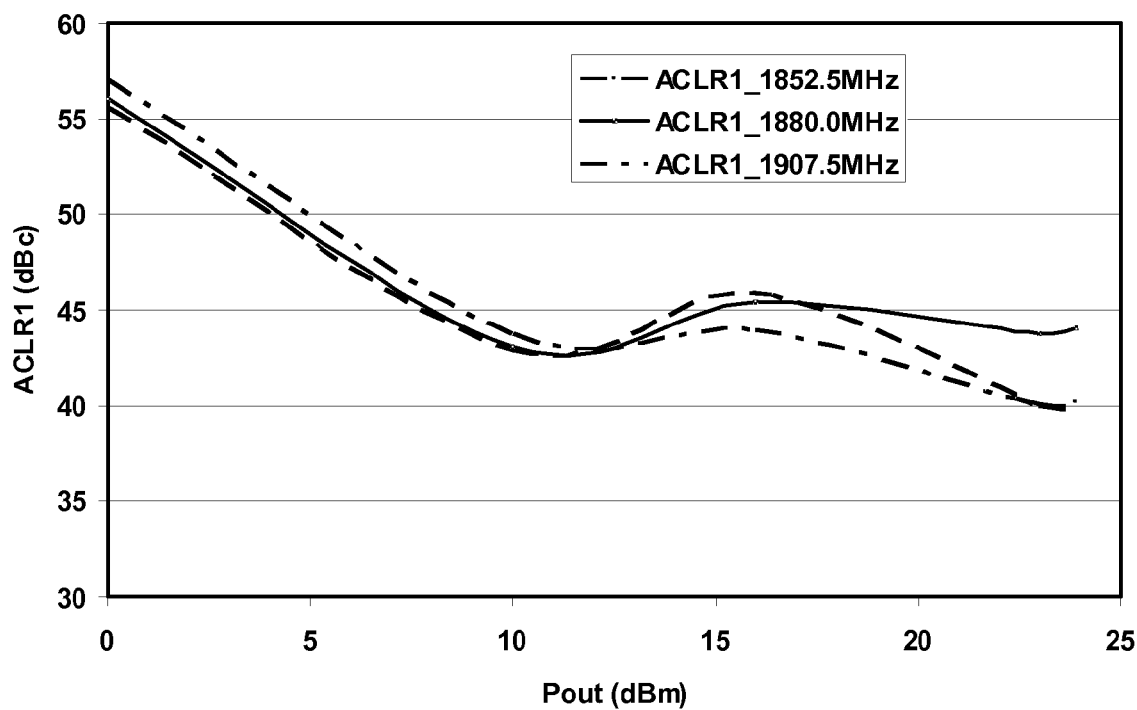
FIG. 16a: ACPR1 v.s. Pout at high mode
Figure 16B:
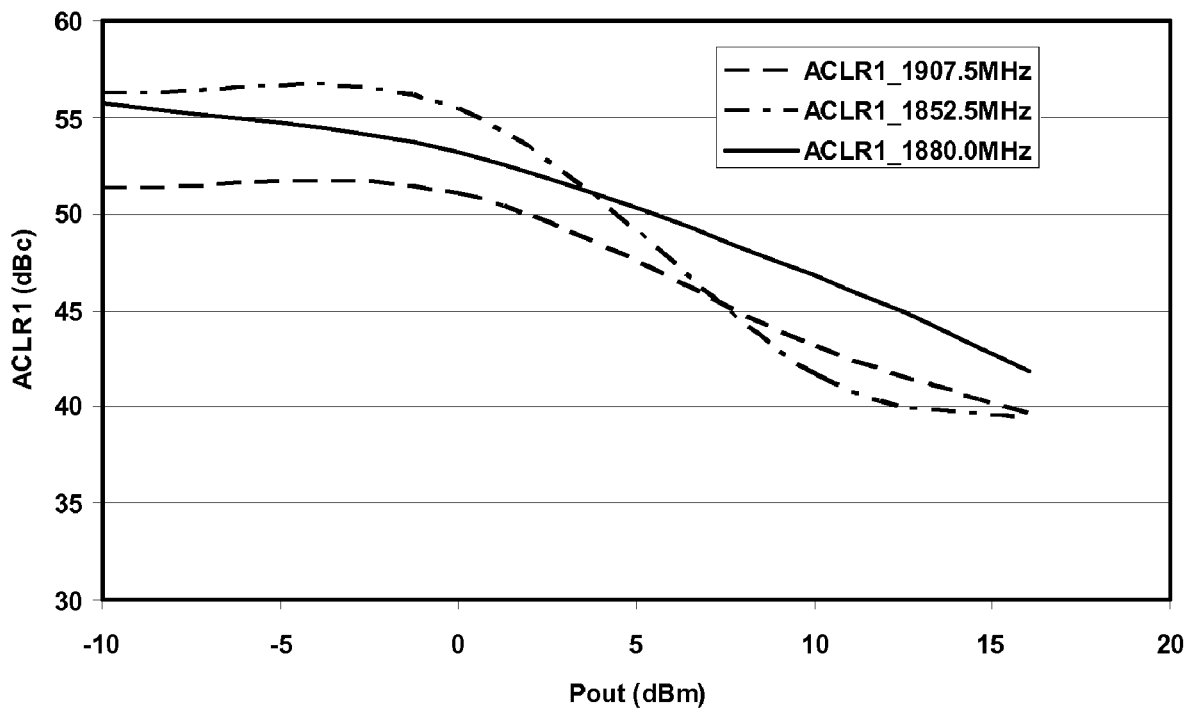
FIG. 16b: ACPR1 v.s. Pout at low mode
Figure 17A:
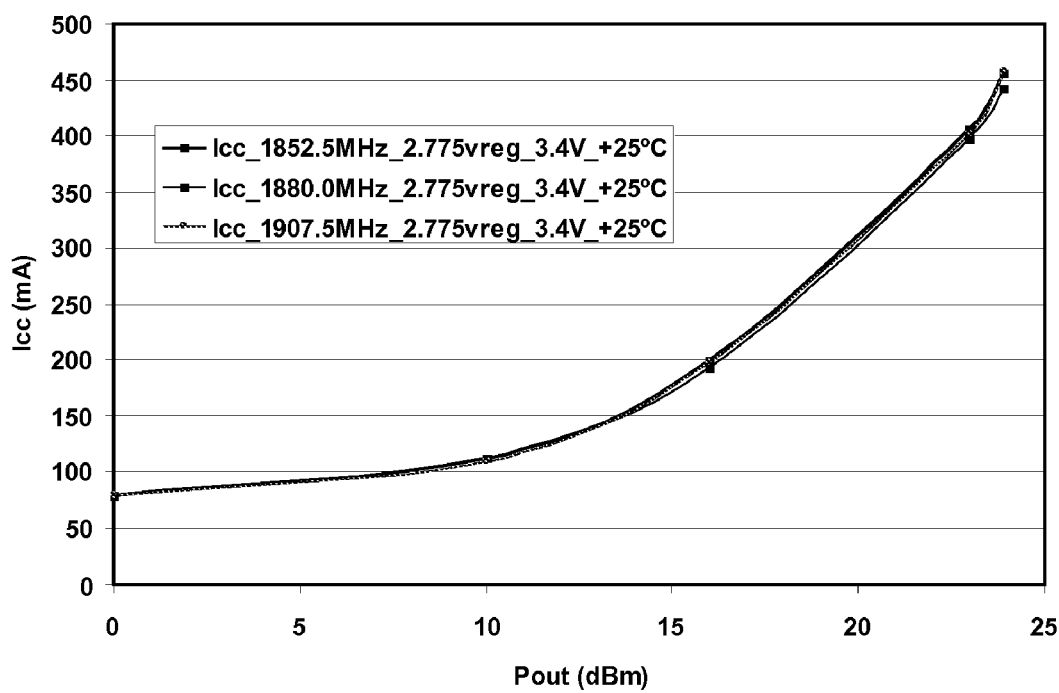
FIG. 17a: Current v.s. Pout at high mode
Figure 17B:
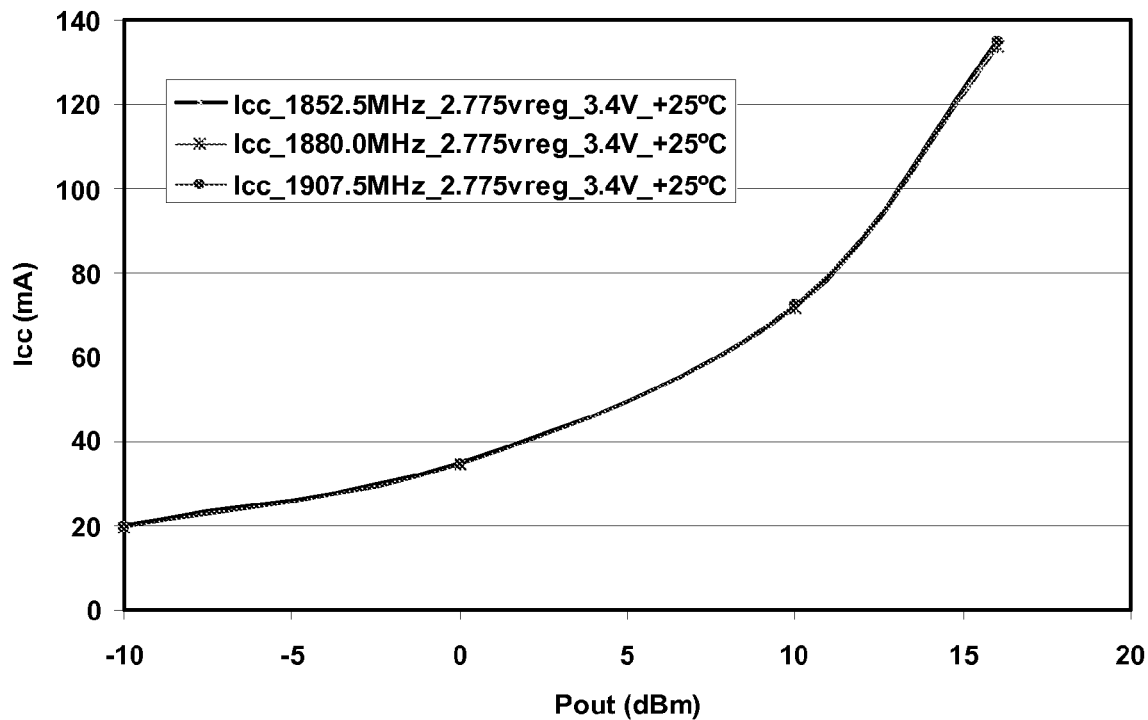
FIG. 17b: Current v.s. Pout at low mode
Figure 18:
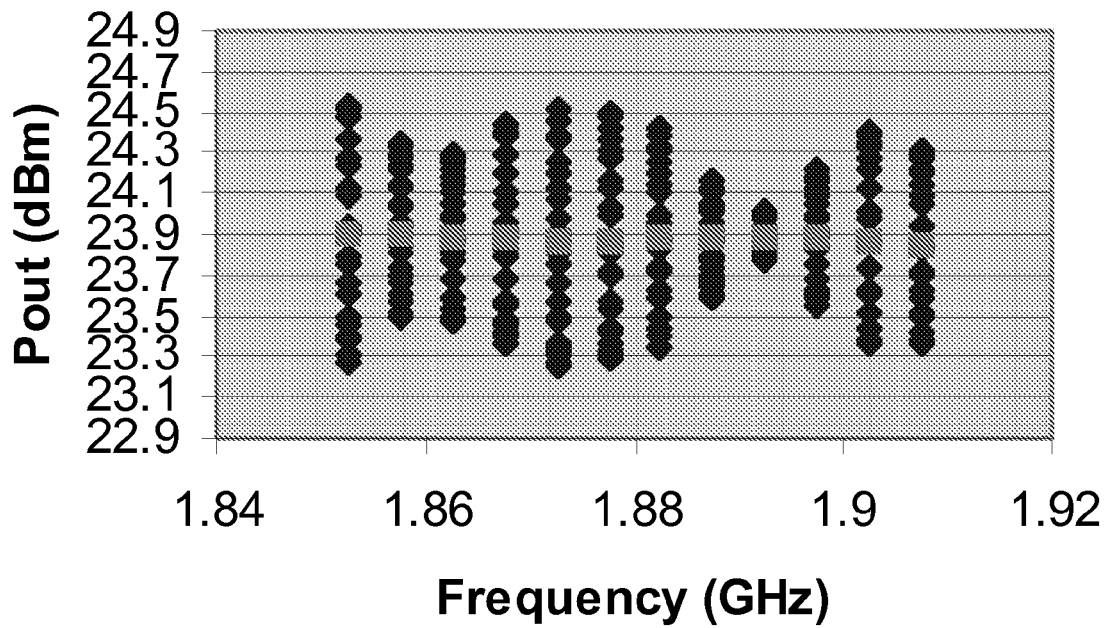
Figure 19:
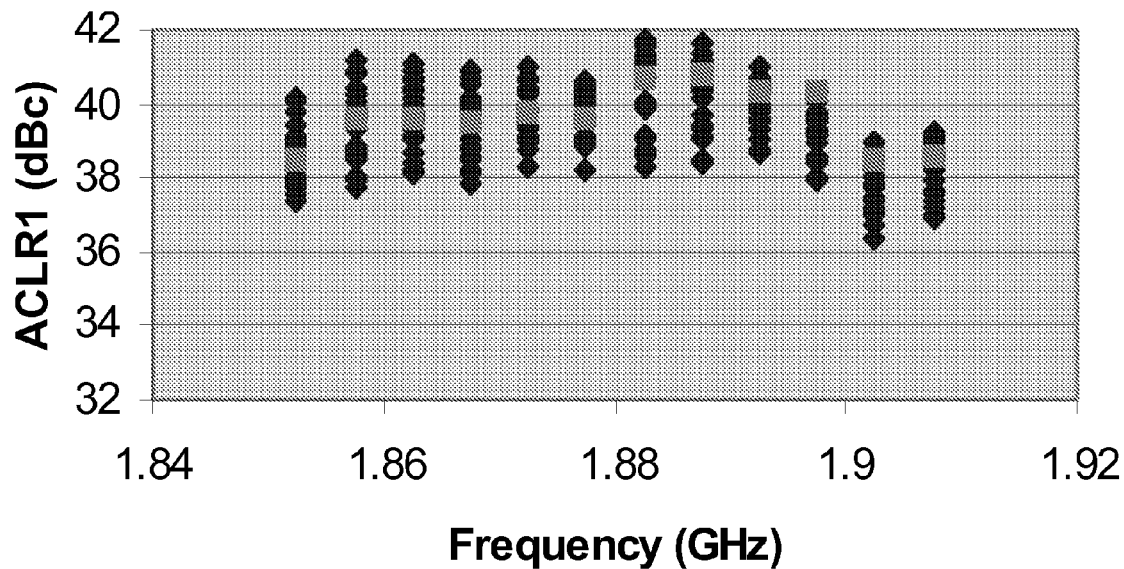
Figure 20:
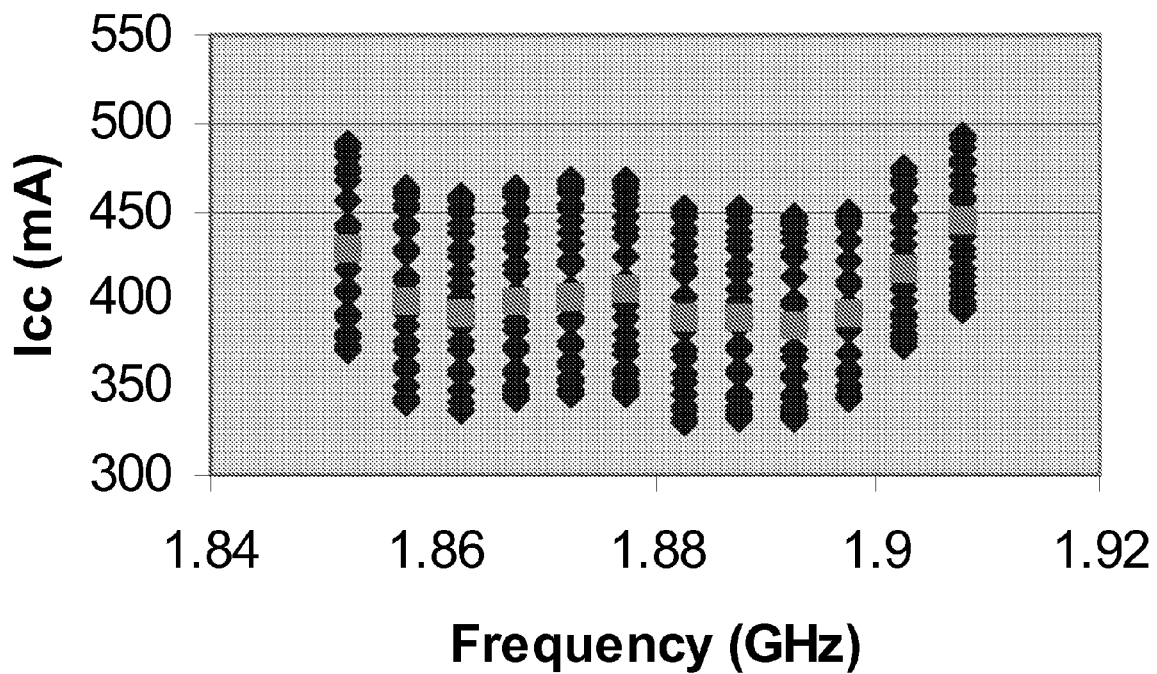

Performance. The switched LIPA and coupler detector die were fabricated using BIFET4-PA 45 GHz ft InGaP emitter Heterojunction Bipolar Transistor (HBT) process. It further uses FETs, HBTs, Schottky diodes, base-collector junction diodes, TaN resistor, MIM capacitors, spiral inductors, vias and bonding pads. An 8 unit-cell HBT was used for the driver stage and a 22 unit cell HBT was used for the output stage at both upper and lower sides. These two die plus input filter and output duplexer were all assembled on 0.5 mm thick FR4 multi-layer laminate. A single package of fully assembled FEM (5×8 mm2) is illustrated in FIG. 15. The switched LIPA by itself achieved the gain of 27.5 dB, ACPR of −40 dBc measured 5 MHz frequency offset and PAE of around 40% @27 dBm output power and PCS frequency band (1850-1910 MHz). The whole FEM had about 23 dB gain, similar level of ACPR as shown in FIG. 16*a* and drew total current of 460 mA @24 dBm output power. At 16 dBm and low power mode, the FEM had gain of 17 dB, ACPR of −41 dBc, as shown in FIG. 16*b* and current of 135 mA. The current consumption at high and low mode is shown in FIGS. 17*a* and 17*b*, respectively. The FEM was optimized so that the output power variation was minimized under load mismatch condition. FIG. 18 shows the power variation at constant detector voltage under 2.5:1 load VSWR. FIGS. 19 and 20 show ACPR and total current variation, respectively. The FEM also shows good stability and ruggedness characteristics, and is capable of surviving a 25:1 load VSWR at the antenna port.

Advantageously, the example power amplifier is a very compact multi-chip front end module at PCS band for wide band CDMA application. It has good performance in both low and high power mode. It works extremely well under load mismatch conditions. An isolator is not required between this module and antenna, which further reduces the system size and cost. It will be understood that this example is just one of many constructions enabled in this disclosure, and one skilled in the art will recognized other components, topologies, and implementations consistent with this teaching.

While particular preferred and alternative embodiments of the present intention have been disclosed, it will be appreciated that many various modifications and extensions of the above described technology may be implemented using the teaching of this invention. All such modifications and extensions are intended to be included within the true spirit and scope of the appended claims.

What is claimed is:

1. A power amplifier circuit, comprising:
   an RF splitter for generating a (+) phase-shifted RF input signal on a first RF amplification path a (−) phase-shifted RF input signal on a second RF amplification path;
   a switch connected to the second RF amplification path, the switch arranged to switch from a high-power state to a low-power state upon receiving a low-power command from a power management circuit, and being constructed to selectably disable the second RF amplification path;
   a first phase shifter for causing a (−) phase-shift in the output of the first RF amplification path, and a second phase shifter for causing a (+) phase-shift in the output of the second RF amplification path; and
   a power combiner connected to the first RF amplification path and the second RF amplification path for generating an RF output signal.

2. The power amplifier circuit according to claim 1 further comprising an active device in the second RF amplification path that is arranged to be disabled responsive to the switch.

3. The power amplifier circuit according to claim 2 wherein the active device is disabled by switching out the active device's power source.

4. The power amplifier circuit according to claim 1 further comprising a transistor in the second RF amplification path, the transistor arranged to be disabled responsive to the switch.

5. The power amplifier circuit according to claim 1 further comprising a pair of transistors in the second RF amplification path that are each arranged to be disabled by switching out the transistors' power source.

6. The power amplifier circuit according to claim 1, wherein the second RF amplification path is not active and the first RF amplification path is active when the switch is in the low power state.

7. The power amplifier circuit according to claim 1, wherein both the first RF amplification path and the second RF amplification path are active when the switch is in a high power state.

8. The power amplifier circuit according to claim 1, the power amplifier circuit having a plurality of network RF topologies:
   RF topology (a): both the first RF amplification path and the second RF amplification path are active when the switch is in a high power state; and
   RF topology (b): the second RF amplification path is not active and the first RF amplification path is active when the switch is in the low power state; and
   wherein the impedance increases at one or more points on the first RF amplification path upon the transition from network RF topology (a) to RF topology (b).

9. The power amplifier circuit according to claim 8, wherein the first RF amplification path has an output transistor, and the impedance at the output of the output transistor is at a first impedance value in RF topology (a) and at a second impedance value in RF topology (b).

10. The power amplifier circuit according to claim 9, wherein the output is the collector of the output transistor.

11. The power amplifier circuit according to claim 9, wherein the second value is higher than the first value, the first value is in the range of about 6 ohms to about 10 ohms, and the second value is in the range of about 10 ohms to about 25 ohms.

12. The power amplifier circuit according to claim 9, wherein the second value is about double the first value.

13. The power amplifier circuit according to claim 9, wherein the second value is higher than the first value, and the second value enables the first RF amplification path to operate efficiently in low-power mode topology (b).

14. The power amplifier circuit according to claim 1, further including an impedance device connected to the first phase-shifter, the second phase-shifter, and the power combiner.

15. The power amplifier circuit according to claim 14, wherein the impedance device has a low-power impedance and high-power impedance set responsive to the power management circuit.

16. The power amplifier circuit according to claim 15, wherein the impedance device is a variable-resistance switch, a variable impedance switch, a variable impedance device, or a transistor.

17. The power amplifier circuit according to claim 15, the power amplifier circuit having a plurality of network RF topologies:
   RF topology (a): both the first RF amplification path and the second RF amplification path are active and the impedance device is at the high-power impedance when the switch is in a high power state; and
   RF topology (b): the second RF amplification path is not active, the first RF amplification path is active, and the impedance device is at the low-power impedance when the switch is in the low power state; and wherein the impedance increases at one or more points on the first RF amplification path upon the transition from network RF topology (a) to RF topology (b).

18. The power amplifier circuit according to claim 17, wherein the first RF amplification path has an output transistor, and the impedance at the output of the output transistor is at a first impedance value in RF topology (a) and at a second impedance value in RF topology (b).

19. The power amplifier circuit according to claim 18, wherein the output is the collector of the output transistor.

20. The power amplifier circuit according to claim 18, wherein the second value is higher than the first value, the first value is in the range of about 6 ohms to about 10 ohms, and the second value is in the range of about 10 ohms to about 25 ohms.

21. The power amplifier circuit according to claim 18, wherein the second value is about double the first value.

22. The power amplifier circuit according to claim 18, wherein the second value is higher than the first value, and the second value enables the first RF amplification path to operate efficiently in low-power mode topology (b).

23. The power amplifier circuit according to claim 14, wherein the impedance device is a passive device.

24. The power amplifier circuit according to claim 14, wherein the impedance device is an active device.

25. A power amplifier circuit, comprising:
a first radio frequency (RF) amplification path and a second RF amplification path, the first RF amplification path for carrying a positive (+) phase-shifted RF input signal, and the second RF amplification path for carrying a negative (−) phase-shifted RF input signal;
a power management circuit for generating a high-power command and a low-power command;
a switch connected to the second RF amplification path and arranged to act responsive to receiving the low-power command from the power management circuit;
an active device in the second RF amplification path that is arranged to be disabled responsive to the switch;
a first phase shifter for causing a negative (−) phase-shift in an output of the first RF amplification path;
a second phase shifter for causing a positive (+) phase-shift in an output of the second RF amplification path;
a power combiner connected to the first RF amplification path and the second RF amplification path for generating an RF output signal; and
an impedance device connected to the first phase-shifter, the second phase-shifter, and the power combiner, and wherein the impedance device has a low-power impedance and a high-power impedance, and one of the low-power impedance and high-power impedance is selected in response to the power management circuit.

26. The power amplifier circuit according to claim 25, the power amplifier circuit having a plurality of network RF topologies:
RF topology (a): both the first RF amplification path and the second RF amplification path are active when the switch is in a high power state; and
RF topology (b): the second RF amplification path is not active and the first RF amplification path is active when the switch is in the low power state; and wherein the impedance increases at one or more points on the first RF amplification path upon the transition from network RF topology (a) to RF topology (b).

27. The power amplifier circuit according to claim 25, the power amplifier circuit having a plurality of network RF topologies:
RF topology (a): both the first RF amplification path and the second amplification path are active and the impedance device is at the high-power impedance when the switch is in a high power state; and
RF topology (b): the second RF amplification path is not active, the first RF amplification path is active, and the impedance device is at the low-power impedance when the switch is in the low power state; and
wherein the impedance increases at one or more points on the first RF amplification path upon the transition from network RF topology (a) to RF topology (b).

28. A method operating on a power amplifier circuit, comprising the steps of:
receiving a radio frequency (RF) input signal;
splitting the RF input signal into a first RF amplification path and a second RF amplification path, the first amplification path carrying a positive (+) phase-shifted RF input signal, and the second RF amplification path carrying a negative (+) phase-shifted RF input signal;
activating both the first RF amplification path and the second RF amplification path when the power amplifier circuit is operating in a high power mode;
shifting a phase in an output of the first RF amplification path to cause a negative (−) phase-shift;
shifting a phase in an output of the second RF amplification path to cause a positive (+) phase-shift;
combining the first RF amplification path and the second RF amplification path to generate an RF output signal;
receiving a low-power signal indicating that the power amplifier circuit is to operate in a low power mode;
deactivating the second RF amplification path responsive to the low power signal; and
using the first RF amplification path when the power amplifier circuit is operating in the low power mode; and
activating an impedance device coupled to the first and second RF amplification paths, wherein the impedance device has a low-power impedance and high-power impedance, and the low-power impedance is selected in response to the low-power signal.

29. The method according to claim 28, wherein the RF input signal has a frequency in the range of about 800 MHz to about 2000 MHz.

30. The method according to claim 28, further including the step of increasing the impedance at one or more points of the first RF amplification path responsive to deactivating the second RF amplification path.

31. The method according to claim 28, further including the step of increasing the impedance at one or more points of the first RF amplification path responsive to deactivating the second RF amplification path.

32. The method according to claim 28, wherein the RF input signal is compliant with an RF signal compliant with a telecommunications standard selected from the group consisting of: CDMA, CDMA95, CDMA2000, WCDMA, GPRS, EDGE, GSM, PHS, PCS, and UMTS.

* * * * *